US006496034B2

(12) United States Patent
Forbes et al.

(10) Patent No.: US 6,496,034 B2
(45) Date of Patent: Dec. 17, 2002

(54) PROGRAMMABLE LOGIC ARRAYS WITH ULTRA THIN BODY TRANSISTORS

(75) Inventors: Leonard Forbes, Corvallis, OR (US); Kie Y. Ahn, Chappaqua, NY (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/780,087

(22) Filed: Feb. 9, 2001

(65) Prior Publication Data

US 2002/0109526 A1 Aug. 15, 2002

(51) Int. Cl.[7] ............................................. H03K 19/177
(52) U.S. Cl. ........................ 326/41; 326/102; 257/202; 257/302
(58) Field of Search ............................... 326/37–41, 44, 326/101, 102; 257/202, 302, 320, 330

(56) References Cited

U.S. PATENT DOCUMENTS

| | | | | |
|---|---|---|---|---|
| 4,864,375 A | * | 9/1989 | Teng et al. ................. | 257/302 |
| 5,691,230 A | | 11/1997 | Forbes ........................ | 437/62 |
| 6,072,209 A | | 6/2000 | Noble et al. ................ | 257/296 |
| 6,134,175 A | | 10/2000 | Forbes et al. ........... | 365/230.06 |
| 6,150,687 A | | 11/2000 | Noble et al. ................ | 257/302 |
| 6,174,784 B1 | | 1/2001 | Forbes ........................ | 438/405 |
| 6,208,164 B1 | | 3/2001 | Noble et al. ................. | 326/41 |

OTHER PUBLICATIONS

Hergenrother, J.M., "The Vertical Replacement–Gate (VRG) MOSFET: A 50nm Vertical MOSFET with Lithography–Independent Gate Length", *IEEE*, pp. 75–78, (1999).

Kalavade, P., et al., "A Novel sub–10nm Transistor", *IEEE Device Research Conference*, Denver, Co., pp. 71–72, (2000).

Xuan, P., et al., "60nm Planarized Ultra–thin Body Solid Phase Epitaxy MOSFETs", *IEEE Device Research Conference*, Denver, CO, pp. 67–68, (2000).

* cited by examiner

*Primary Examiner*—Don Phu Le
(74) *Attorney, Agent, or Firm*—Schwegman, Lundberg, Woessner & Kluth, P.A.

(57) ABSTRACT

Structures and methods for programmable logic arrays are provided. In one embodiment, the programmable logic array includes a first logic plane and a second logic plane. The first logic plane receives a number of input signals. The first logic plane has a plurality of logic cells arranged in rows and columns that are interconnected to provide a number of logical outputs. The second logic plane has a number of logic cells arranged in rows and columns that receive the outputs of the first logic plane and that are interconnected to produce a number of logical outputs such that the programmable logic array implements a logical function. Each of the logic cells includes a vertical pillar extending outwardly from a semiconductor substrate. Each pillar includes a single crystalline first contact layer and a second contact layer separated by an oxide layer. Each logic cell further includes at least one single crystalline ultra thin vertical transistor that is selectively disposed adjacent the vertical pillar. The single crystalline vertical transistors have an ultra thin single crystalline vertical first source/drain region coupled to the first contact layer, an ultra thin single crystalline vertical second source/drain region coupled to the second contact layer; and an ultra thin single crystalline vertical body region which opposes the oxide layer and couples the first and the second source/drain regions.

78 Claims, 18 Drawing Sheets

$V_G \longrightarrow V_G/k$  $V_0 \longrightarrow V_0/k$ $t_{ox} \longrightarrow t_{ox}/k$ $L \longrightarrow L/k$ $X_j \longrightarrow X_j/k$  JUNCTION DEPTH DECREASED $W_d \longrightarrow W_d/k$ $N_A \longrightarrow k N_A$  SUBSTRATE DOPING INCREASED

PROGRAMMABLE LOGIC ARRAYS WITH ULTRA THIN BODY TRANSISTORS

CROSS REFERENCE TO RELATED APPLICATIONS

This application is related to the following co-pending, commonly assigned U.S. patent applications: "Open Bit Line DRAM with Ultra Thin Body Transistors," Ser. No. 09/780,125, "Folded Bit Line DRAM with Ultra Thin Body Transistors," Ser. No. 09/780,130, "Memory Address and Decode Circuits with Ultra Thin Body Transistors," Ser. No. 09/780,144, "Programmable Memory Address and Decode Circuits with Ultra Thin Body Transistors," Ser. No. 09/780,126, "In Service Programmable Logic Arrays with Ultra Thin Body Transistors," Ser. No. 09/780,129, and "Flash Memory with Ultra Thin Vertical Body Transistors," Ser. No. 09/780,169, which are filed on even date herewith and each of which disclosure is herein incorporated by reference.

TECHNICAL FIELD OF THE INVENTION

This invention relates generally to integrated circuits and in particular to programmable logic arrays with ultra thin body transistors.

BACKGROUND OF THE INVENTION

Logic circuits are an integral part of digital systems, such as computers. Essentially, a logic circuit processes a number of inputs to produce a number of outputs for use by the digital system. The inputs and outputs are generally electronic signals that take on one of two "binary" values, a "high" logic value or a "low" logic value. The logic circuit manipulates the inputs using binary logic which describes, in a mathematical way, a given or desired relationship between the inputs and the outputs of the logic circuit.

Logic circuits that are tailored to the specific needs of a particular customer can be very expensive to fabricate on a commercial basis. Thus, general purpose very large scale integration (VLSI) circuits are defined. VLSI circuits serve as many logic roles as possible, which helps to consolidate desired logic functions. However, random logic circuits are still required to tie the various elements of a digital system together.

Several schemes are used to implement these random logic circuits. One solution is standard logic, such as transistor-transistor logic (TTL). TTL integrated circuits are versatile because they integrate only a relatively small number of commonly used logic functions. The drawback is that large numbers of TTL integrated circuits are typically required for a specific application. This increases the consumption of power and board space, and drives up the overall cost of the digital system.

One alternative to standard logic is fully custom logic integrated circuits. Custom logic circuits are precisely tailored to the needs of a specific application. This allows the implementation of specific circuit architectures that dramatically reduces the number of parts required for a system. However, custom logic devices require significantly greater engineering time and effort, which increases the cost to develop these circuits and may also delay the production of the end system.

A less expensive alternative to custom logic is the "programmable logic array." Programmable logic arrays take advantage of the fact that complex combinational logic functions can be reduced and simplified into various standard forms. For example, logical functions can be manipulated and reduced down to traditional Sum of Products (SOP) form. In SOP form, a logical function uses just two types of logic functions that are implemented sequentially. This is referred to as two-level logic and can be implemented with various conventional logic functions, e.g., AND-OR, NAND-NAND, NOR-NOR.

One benefit of the programmable logic array is that it provides a regular, systematic approach to the design of random, combinational logic circuits. A multitude of logical functions can be created from a common building block, e.g., an array of transistors. The logic array is customized or "programmed" by creating a specific metallization pattern to interconnect the various transistors in the array to implement the desired function.

Programmable logic arrays are fabricated using photolithographic techniques that allow semiconductor and other materials to be manipulated to form integrated circuits as is known in the art. These photolithographic techniques essentially use light that is focused through lenses and masks to define patterns in the materials with microscopic dimensions. The equipment and techniques that are used to implement this photolithography provide a limit for the size of the circuits that can be formed with the materials. Essentially, at some point, the lithography cannot create a fine enough image with sufficient clarity to decrease the size of the elements of the circuit. In other words, there is a minimum dimension that can be achieved through conventional photolithography. This minimum dimension is referred to as the "critical dimension" (CD) or minimum "feature size" (F) of the photolithographic process. The minimum feature size imposes one constraint on the size of the components of a programmable logic array. In order to keep up with the demands for larger programmable logic arrays, designers search for ways to reduce the size of the components of the array.

As the density requirements become higher and higher in logic and memories it becomes more and more crucial to minimize device area. The programmable logic array (PLA) circuit in the NOR-NOR configuration is one example of an architecture for implementing logic circuits.

The continuous scaling, however, of MOSFET technology to the deep sub-micron region where channel lengths are less than 0.1 micron, 100 nm, or 1000 A causes significant problems in the conventional transistor structures. As shown in FIG. 1, junction depths should be much less than the channel length of 1000 A, or this implies junction depths of a few hundred Angstroms. Such shallow junctions are difficult to form by conventional implantation and diffusion techniques. Extremely high levels of channel doping are required to suppress short-channel effects such as drain-induced barrier lowering; threshold voltage roll off, and sub-threshold conduction. Sub-threshold conduction is particularly problematic in DRAM technology as it reduces the charge storage retention time on the capacitor cells. These extremely high doping levels result in increased leakage and reduced carrier mobility. Thus making the channel shorter to improve performance is negated by lower carrier mobility.

For the reasons stated above, and for other reasons stated below which will become apparent to those skilled in the art upon reading and understanding the present specification, there is a need in the art for a programmable logic array that uses less surface area of a semiconductor wafer as compared to conventional decoder arrays.

SUMMARY OF THE INVENTION

The above mentioned problems with programmable logic arrays and other problems are addressed by the present invention and will be understood by reading and studying the following specification. A circuit and method for a programmable logic array using ultra thin body vertical transistors is provided.

In particular, one embodiment of the present invention includes a programmable logic array having a first logic plane and a second logic plane. The first logic plane receives a number of input signals. The first logic plane has a plurality of logic cells arranged in rows and columns that are interconnected to provide a number of logical outputs. The second logic plane has a number of logic cells arranged in rows and columns that receive the outputs of the first logic plane and that are interconnected to produce a number of logical outputs such that the programmable logic array implements a logical function. Each of the logic cells includes a vertical pillar extending outwardly from a semiconductor substrate. Each. pillar includes a single crystalline first contact layer and a second contact layer separated by an oxide layer. Each logic cell further includes at least one single crystalline ultra thin vertical transistor that is selectively disposed adjacent the vertical pillar. The single crystalline vertical transistors have an ultra thin single crystalline vertical first source/drain region coupled to the first contact layer, an ultra thin single crystalline vertical second source/drain region coupled to the second contact layer; and an ultra thin single crystalline vertical body region which opposes the oxide layer and couples the first and the second source/drain regions. The ultra thin single crystalline vertical transistors have a vertical length of less than 100 nanometers and a horizontal width of less than 10 nanometers.

These and other embodiments, aspects, advantages, and features of the present invention will be set forth in part in the description which follows, and in part will become apparent to those skilled in the art by reference to the following description of the invention and referenced drawings or by practice of the invention. The aspects, advantages, and features of the invention are realized and attained by means of the instrumentalities, procedures, and combinations particularly pointed out in the appended claims.

DESCRIPTION OF THE PREFERRED EMBODIMENTS

In the following detailed description of the invention, reference is made to the accompanying drawings which form a part hereof, and in which is shown, by way of illustration, specific embodiments in which the invention may be practiced. The embodiments are intended to describe aspects of the invention in sufficient detail to enable those skilled in the art to practice the invention. Other embodiments may be utilized and changes may be made without departing from the scope of the present invention. In the following description, the terms wafer and substrate are interchangeably used to refer generally to any structure on which integrated circuits are formed, and also to such structures during various stages of integrated circuit fabrication. Both terms include doped and undoped semiconductors, epitaxial layers of a semiconductor on a supporting semiconductor or insulating material, combinations of such layers, as well as other such structures that are known in the art.

The illustrative embodiments described herein concern electrical circuitry which uses voltage levels to represent binary logic states—namely, a "high" logic level and a "low" logic level. Further, electronic signals used by the various embodiments of the present invention are generally considered active when they are high. However, a bar over the signal name in this application indicates that the signal is negative or inverse logic. Negative or inverse logic is considered active when the signal is low.

The term "horizontal" as used in this application is defined as a plane parallel to the conventional plane or surface of a wafer or substrate, regardless of the orientation of the wafer or the substrate. The term "vertical" refers to a direction perpendicular to the horizontal as defined above.

Prepositions, such as "on," "side," (as in sidewall), "higher," "lower," "over," and "under" are defined with respect to the conventional plane or surface being on the top surface of the wafer or substrate, regardless of the orientation of the wafer or substrate. The following detailed description is not to be taken in a limiting sense, and the scope of the present invention is defined only by the appended claims.

Throughout this specification the designation "n+" refers to semiconductor material that is heavily doped n-type semiconductor material, e.g., monocrystalline silicon or polycrystalline silicon. Similarly, the designation "p+" refers to semiconductor material that is heavily doped p-type semiconductor material. The designations "n-" and "p-" refer to lightly doped n and p-type semiconductor materials, respectively.

Figure 1:
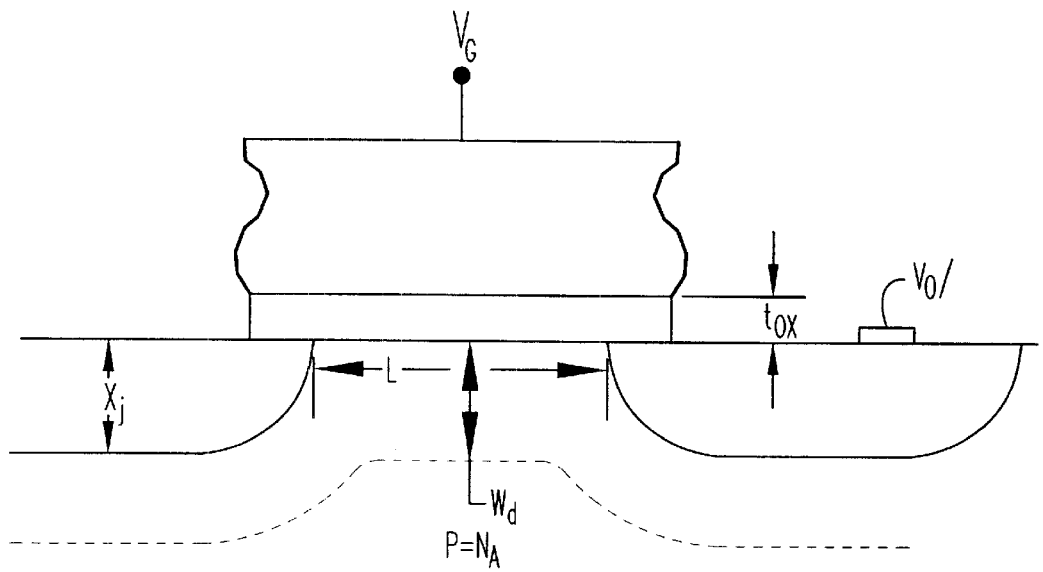
FIG. 1 is an illustration of a convention MOSFET transistor illustrating the shortcomings of such conventional MOSFETs as continuous scaling occurs to the deep submicron region where channel lengths are less than 0.1 micron, 100 nm, or 1000 A.
Figure 2:
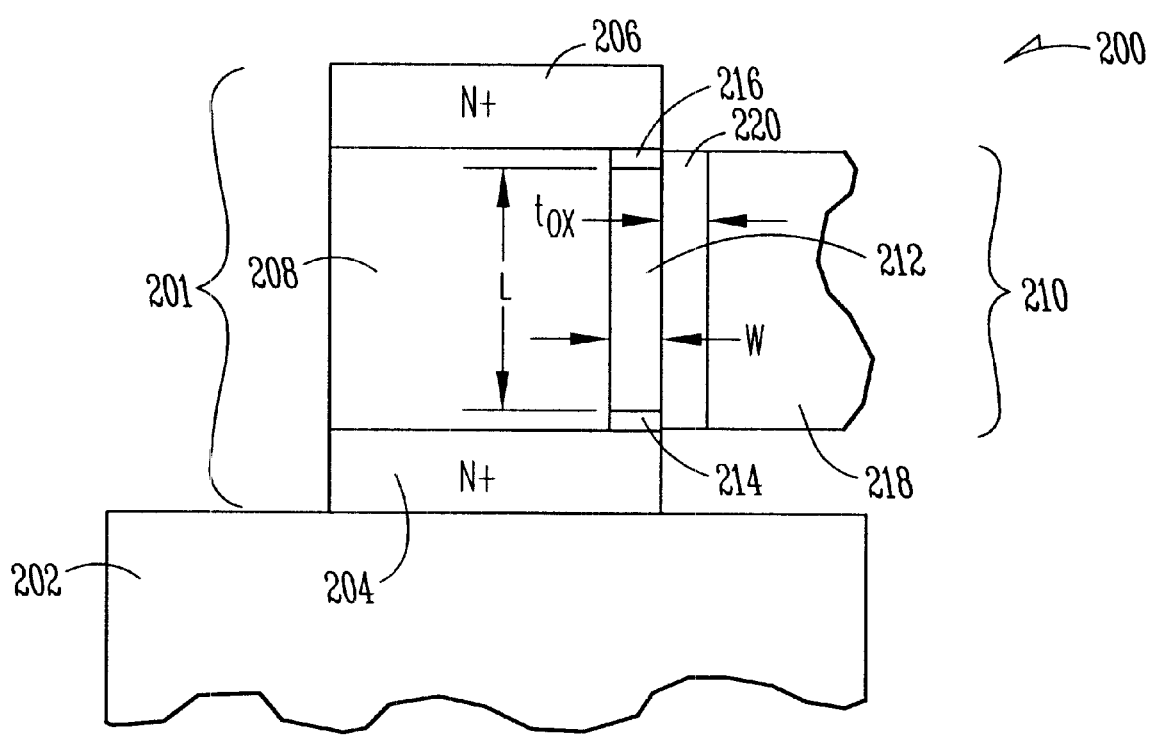
FIG. 2 is a diagram illustrating a vertical ultra thin body transistor formed along side of a pillar according to the teachings of the present invention.

FIG. 2 is a diagram illustrating an access FET 200 formed according to the teachings of the present invention which make up a portion of the programmable logic array. As shown in FIG. 2, access FET 200 includes a vertical ultra thin body transistor, or otherwise stated an ultra thin single crystalline vertical transistor. According to the teachings of the present invention, the structure of the access FET 200 includes a pillar 201 extending outwardly from a semiconductor substrate 202. The pillar includes a single crystalline first contact layer 204 and a single crystalline second contact layer 206 vertically separated by an oxide layer 208. An ultra thin single crystalline vertical transistor 210 is formed along side of the pillar 201. The ultra thin single crystalline vertical transistor 210 includes an ultra thin single crystalline vertical body region 212 which separates an ultra thin single crystalline vertical first source/drain region 214 and an ultra thin single crystalline vertical second source/drain region 216. A gate 218, which may be integrally formed with a word line as described above and below, is formed opposing the ultra thin single crystalline vertical body region 212 and is separated therefrom by a thin gate oxide layer 220.

According to embodiments of the present invention, the ultra thin single crystalline vertical transistor 210 includes a transistor having a vertical length of less than 100 nanometers and a horizontal width of less than 10 nanometers. Thus, in one embodiment, the ultra thin single crystalline vertical body region 212 includes a channel having a vertical length (L) of less than 100 nanometers. Also, the ultra thin single crystalline vertical body region 212 has a horizontal width (W) of less than 10 nanometers. And, the ultra thin single crystalline vertical first source/drain region 214 and an ultra thin single crystalline vertical second source/drain region 216 have a horizontal width of less than 10 nanometers. According to the teachings of the present invention, the ultra thin single crystalline vertical transistor 210 is formed from solid phase epitaxial growth.

An n-channel type transistor is shown in the embodiment of FIG. 2. However, one of ordinary skill in the art will further understand upon reading this disclosure that the conductivity types described herein can be reversed by altering doping types such that the present invention is equally applicable to include structures having ultra thin vertically oriented single crystalline p-channel type transistors. The invention is not so limited.

Figure 3A:
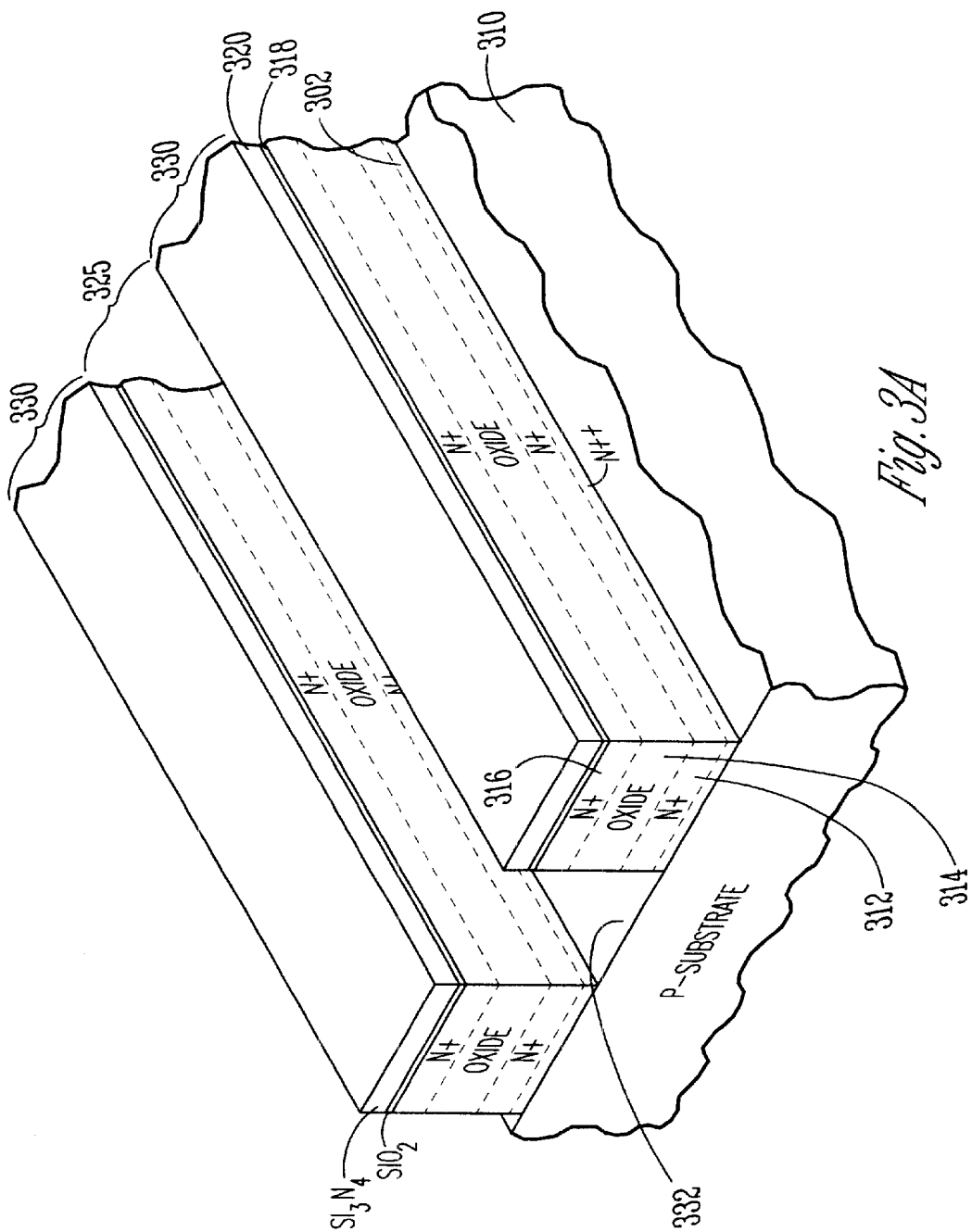
FIGS. 3A–3C illustrate an initial process sequence for forming pillars along side of which vertical ultra thin body transistors can later be formed according to the teachings of the present invention.
Figure 3B:
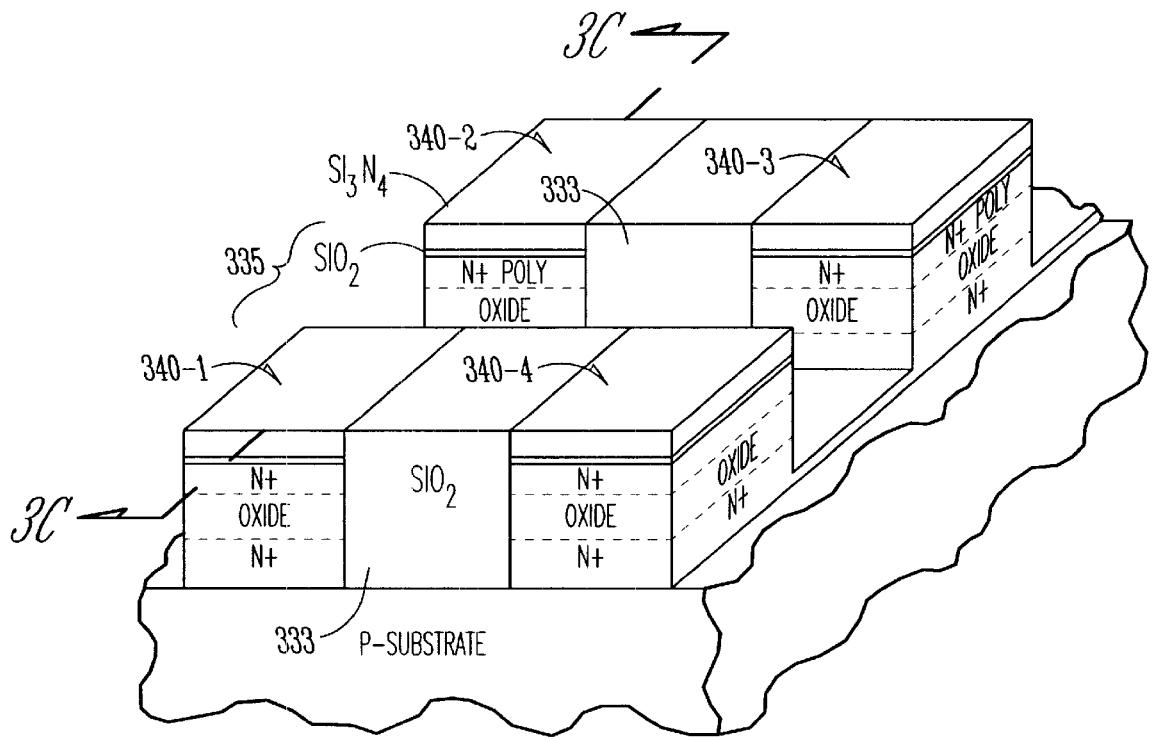
Figure 3C:
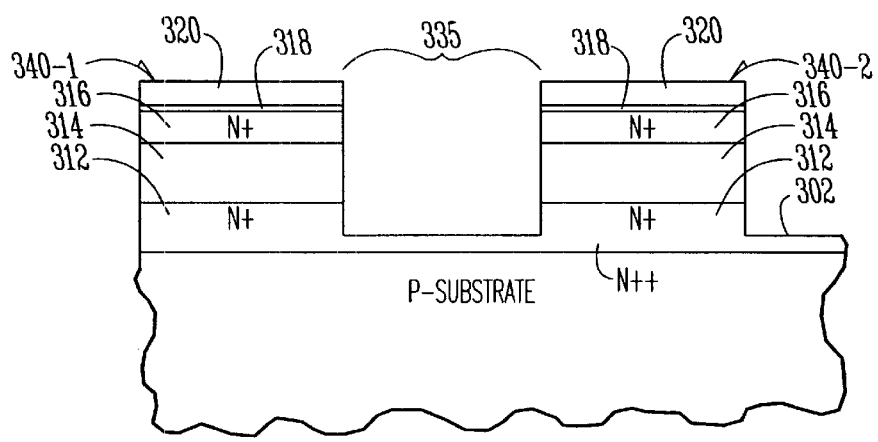

FIGS. 3A–3C illustrate an initial process sequence for forming pillars along side of which vertical ultra thin body transistors can later be formed as part of forming a programmable logic array according to the teachings of the present invention. The dimensions suggested are appropriate to a 0.1 $\mu$m cell dimension (CD) technology and may be scaled accordingly for other CD sizes. In the embodiment of FIG. 3A, a p-type bulk silicon substrate 310 starting material is used. An n++ and n+ silicon composite first contact layer 312 is formed on substrate 310, such as by ion-implantation, epitaxlial growth, or a combination of such techniques to form a single crystalline first contact layer 312. According to the teachings of the present invention, the more heavily conductively doped lower portion of the first contact layer 312 also functions as the bit line 302. The thickness of the n++ portion of first contact layer 312 is that of the desired bit line 302 thickness, which can be approximately between 0.1 to 0.25 $\mu$m. The overall thickness of the first contact layer 312 can be approximately between 0.2 to 0.5 $\mu$m. An oxide layer 314 of approximately 100 nanometers (nm), 0.1 $\mu$m, thickness or less is formed on the first contact layer 312. In one embodiment, the oxide layer 314 can be formed by thermal oxide growth techniques. A second contact layer 316 of n+ silicon is formed on the oxide layer 314, using know techniques to form a polycrystalline second contact layer 316. The second contact layer 316 is formed to a thickness of 100 nm or less.

Next, a thin silicon dioxide layer ($SiO_2$) 318 of approximately 10 nm is deposited on the second contact layer 316. A thicker silicon nitride layer ($Si_3N_4$) 320 of approximately 100 nm in thickness is deposited on the thin silicon dioxide layer ($SiO_2$) 318 to form pad layers, e.g. layers 318 and 320. These pad layers 318 and 320 can be deposited using any suitable technique such as by chemical vapor deposition (CVD).

A photoresist is applied and selectively exposed to provide a mask for the directional etching of trenches 325, such as by reactive ion etching (RIE). The directional etching results in a plurality of column bars 330 containing the stack of nitride layer 320, pad oxide layer 318, second contact layer 316, oxide layer 314, and first contact layer 312. Trenches 325 are etched to a depth that is sufficient to reach the surface 332 of substrate 310, thereby providing separation between conductively doped bit lines 302. The photoresist is removed. Bars 330 are now oriented in the direction of bit lines 302, e.g. column direction. In one embodiment, bars 330 have a surface line width of approximately 0.1 micron or less. The width of each trench 325 can be approximately equal to the line width of bars 330. The structure is now as appears in FIG. 3A.

In FIG. 3B, isolation material 333, such as $SiO_2$ is deposited to fill the trenches 325. The working surface is then planarized, such as by chemical mechanical polishing/planarization (CMP). A second photoresist is applied and selectively exposed to provide a mask for the directional etching of trenches 335 orthogonal to the bit line 302 direction, e.g. row direction. Trenches 335 can be formed using any suitable technique such as by reactive ion etching (RIE). Trenches 335 are etched through the exposed $SiO_2$ and the exposed stack of nitride layer 320, pad oxide layer 318, second contact layer 316, oxide layer 314, and into the first contact layer 312 but only to a depth sufficient to leave the desired bit line 302 thickness, e.g. a remaining bit line thickness of typically 100 nm. The structure is now as appears in FIGS. 3B having individually defined pillars 340-1, 340-2, 340-3, and 340-4.

FIG. 3C illustrates a cross sectional view of the structure shown in FIG. 3B taken along cut-line 3C—3C. FIG. 3C shows the continuous bit line 302 connecting adjacent pillars 340-1 and 340-2 in any given column. Trench 335 remains for the subsequent formation of wordlines, as described below, in between adjacent rows of the pillars, such as a row formed by pillars 340-1 and 340-4 and a row formed by pillars 340-2, and 340-3.

Figure 4A:
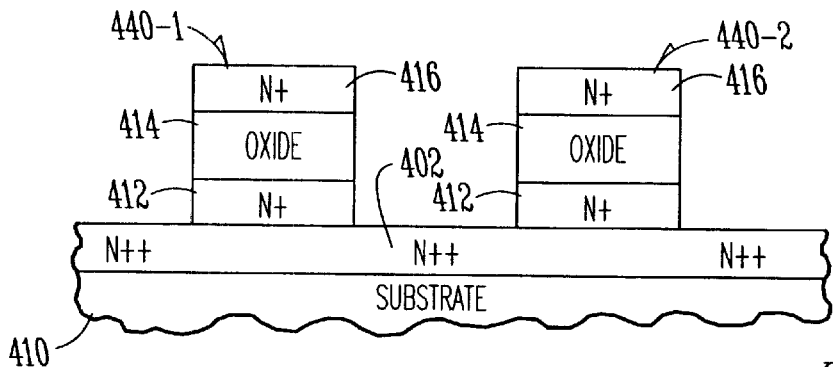
FIGS. 4A–4C illustrate that the above techniques described in connection with FIGS. 3A–3C can be implemented with a bulk CMOS technology or a silicon on insulator (SOI) technology.
Figure 4B:
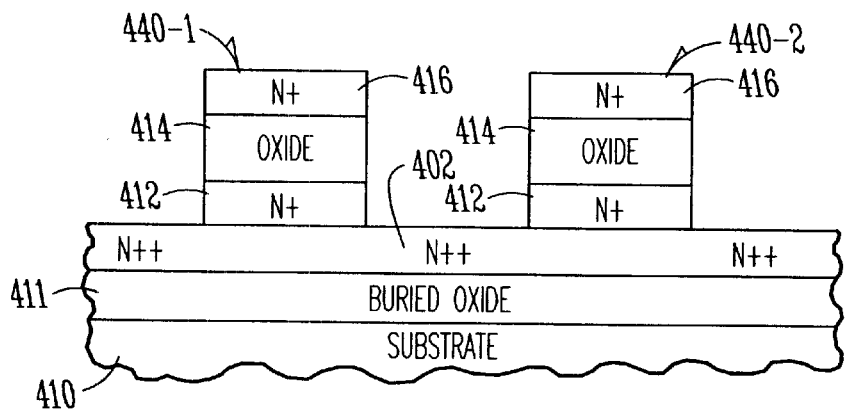
Figure 4C:
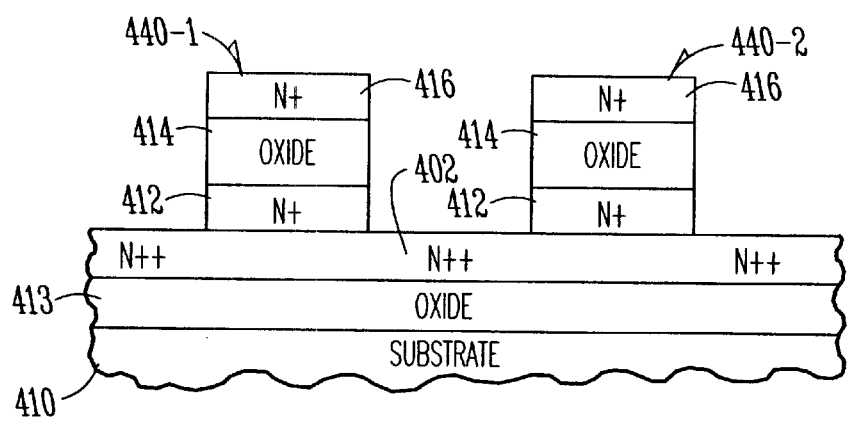

FIGS. 4A–4C illustrate that the above techniques described in connection with FIGS. 3A–3C can be implemented on a bulk CMOS technology substrate or a silicon on insulator (SOI) technology substrate. FIG. 4A represents the completed sequence of process steps shown in FIGS. 3A–3C, minus the pad layers, formed on a lightly doped p-type bulk silicon substrate 410. The structure shown in FIG. 4A is similar to the cross sectional view in FIG. 3C and shows a continuous bit line 402 with pillar stacks 440-1 and 440-2 formed thereon. The pillars 440-1 and 440-2 include an n+ first contact layer 412, an oxide layer 414 formed thereon, and a second n+ contact layer 416 formed on the oxide layer 414.

FIG. 4B represents the completed sequence of process steps shown in FIGS. 3A–3C, minus the pad layers, formed on a commercial SOI wafer, such as SIMOX. As shown in FIG. 4B, a buried oxide layer 411 is present on the surface of the substrate 410. The structure shown in FIG. 4B is also similar to the cross sectional view in FIG. 3C and shows a continuous bit line 402 with pillar stacks 440-1 and 440-2 formed thereon, only here the continuous bit line 402 is separated from the substrate 410 by the buried oxide layer 411. Again, the pillars 440-1 and 440-2 include an n+ first contact layer 412, an oxide layer 414 formed thereon, and a second n+ contact layer 416 formed on the oxide layer 414.

FIG. 4C represents the completed sequence of process steps shown in FIGS. 3A–3C, minus the pad layers, forming islands of silicon on an insulator, where the insulator 413 has been formed by oxide under cuts. Such a process includes the process described in more detail in U.S. Pat. No. 5,691,230, by Leonard Forbes, entitled "Technique for Producing Small Islands of Silicon on Insulator," issued Nov. 25, 1997, which is incorporated herein by reference. The structure shown in FIG. 4C is also similar to the cross sectional view in FIG. 3C and shows a continuous bit line 402 with pillar stacks 440-1 and 440-2 formed thereon, only here the continuous bit line 402 is separated from the substrate 410 by the insulator 413 which has been formed by oxide under cuts such as according to the process referenced above. Again, the pillars 440-1 and 440-2 include an n+ first contact layer 412, an oxide layer 414 formed thereon, and a second n+ contact layer 416 formed on the oxide layer 414. Thus, according to the teachings of the present invention, the sequence of process steps to form pillars, as shown in FIGS. 3A–3C, can include forming the same on at least three different types of substrates as shown FIGS. 4A–4C.

Figure 5A:
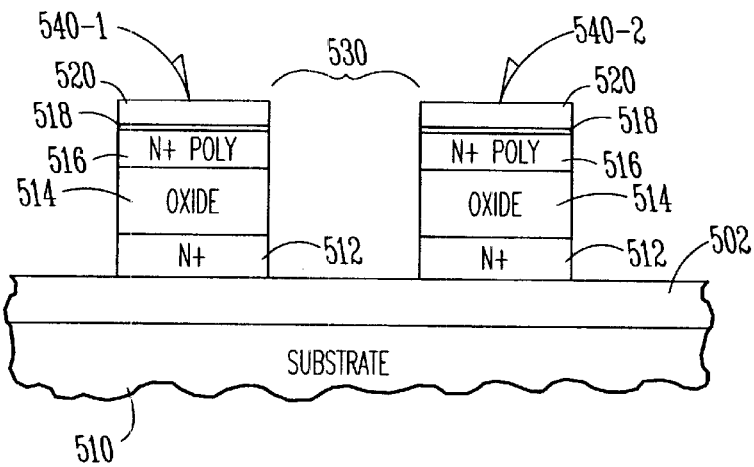
FIGS. 5A–5D illustrate a process sequence continuing from the pillar formation embodiments provided in FIGS. 3A–4C to form vertical ultra thin body transistors along side of the pillars.
Figure 5B:
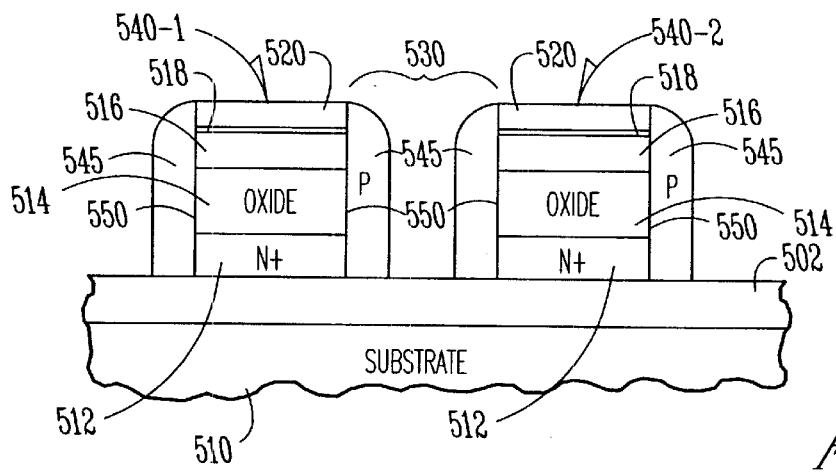
Figure 5C:
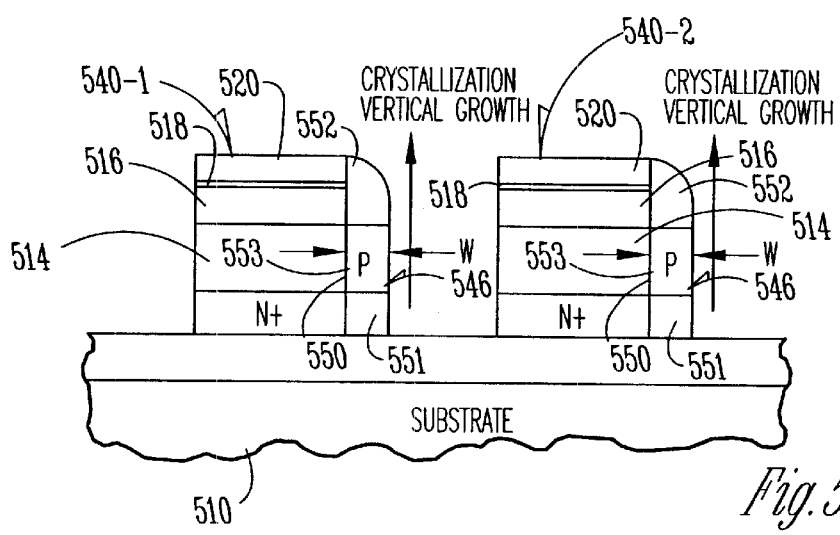

FIGS. 5A–5C illustrate a process sequence continuing from the pillar formation embodiments provided in FIGS. 3A–3C, and any of the substrates shown in FIGS. 4A–4C, to form vertical ultra thin body transistors along side of the pillars, such as pillars 340-1 and 340-2 in FIG. 3C. For purposes of illustration only, FIG. 5A illustrates an embodiment pillars 540-1 and 540-2 formed on a p-type substrate 510 and separated by a trench 530. Analogous to the description provided in connection FIGS. 5A–5C, FIG. 5A shows a first single crystalline n+ contact layer 512 a portion of which, in one embodiment, is integrally formed with an n++ bit line 502. An oxide layer region 514 is formed in pillars 540-1 and 540-2 on the first contact layer 512. A second n+ contact layer 516 is shown formed on the oxide layer region 514 in the pillars 540-1 and 540-2. And, pad layers of (SiO$_2$) 518 and (Si$_3$N$_4$) 520, respectively are shown formed on the second contact layer 516 in the pillars 540-1 and 540-2.

In FIG. 5B, a lightly doped p-type polysilicon layer 545 is deposited over the pillars 540-1 and 540-2 and directionally etched to leave the lightly doped p-type material 545 on the sidewalls 550 of the pillars 540-1 and 540-2. In one embodiment according to the teachings of the present invention, the lightly doped p-type polysilicon layer is directionally etched to leave the lightly doped p-type material 545 on the sidewalls 550 of the pillars 540-1 and 540-2 having a width (W), or horizontal thickness of 10 nm or less. The structure is now as shown in FIG. 5B.

The next sequence of process steps is described in connection with FIG. 5C. At this point another masking step, as the same has been described above, can be employed to isotropically etch the polysilicon 545 off of some of the sidewalls 550 and leave polysilicon 545 only on one sidewall of the pillars 540-1 and 540-2 if this is required by some particular configuration, e.g. forming ultra thin body transistors only on one side of pillars 540-1 and 540-2.

In FIG. 5C, the embodiment for forming the ultra thin single crystalline vertical transistors, or ultra thin body transistors, only on one side of pillars 540-1 and 540-2 is shown. In FIG. 5C, the wafer is heated at approximately 550 to 700 degrees Celsius. In this step, the polysilicon 545 will recrystallize and lateral epitaxial solid phase regrowth will occur vertically. As shown in FIG. 5C, the single crystalline silicon at the bottom of the pillars 540-1 and 540-2 will seed this crystal growth and an ultrathin single crystalline film 546 will form which can be used as the channel of an ultra thin single crystalline vertical MOSFET transistor. In the embodiment of FIG. 5C, where the film is left only on one side of the pillar, the crystallization will proceed vertically and into the n+ polysilicon second contact material/layer 516 on top of the pillars 540-1 and 540-2. If however, both sides of the pillars 540-1 and 540-2 are covered, the crystallization will leave a grain boundary near the center on top of the pillars 540-1 and 540-2. This embodiment is shown in FIG. 5D.

Figure 5D:
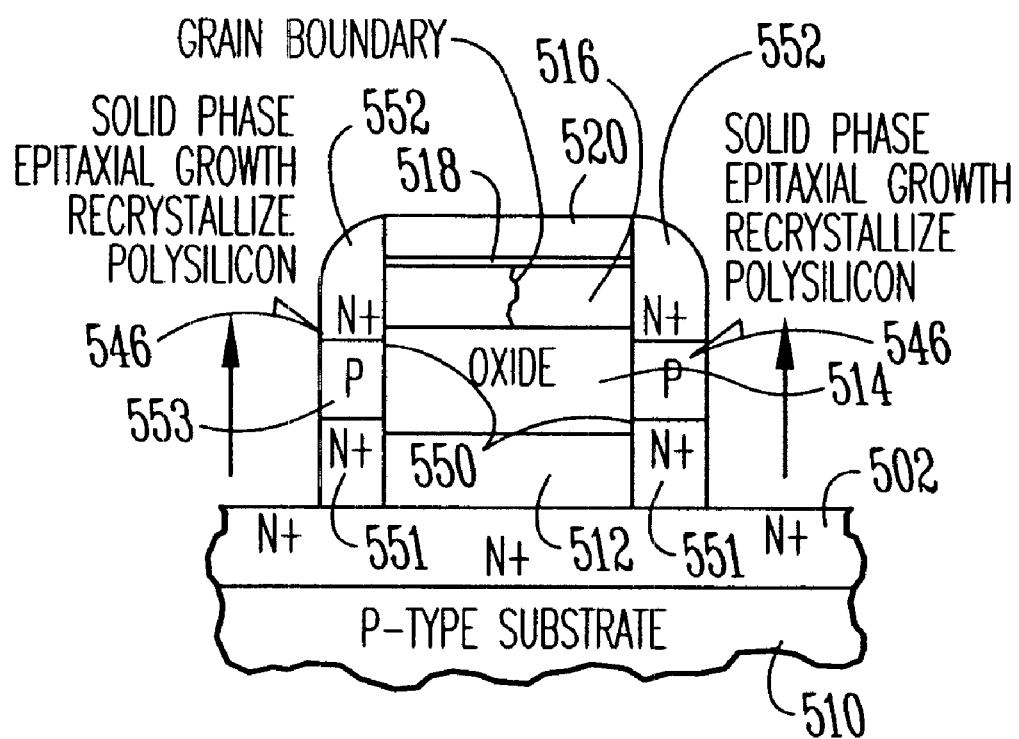

As shown in FIGS. 5C and 5D, drain and source regions, 551 and 552 respectively, will be formed in the ultrathin single crystalline film 546 along the sidewalls 550 of the pillars 540-1 and 540-2 in the annealing process by an out diffusion of the n+ doping from the first and the second contact layers, 512 and 516. In the annealing process, these portions of the ultrathin single crystalline film 546, now with the n+ dopant, will similarly recrystallize into single crystalline structure as the lateral epitaxial solid phase regrowth occurs vertically. The drain and source regions, 551 and 552, will be separated by a vertical single crystalline body region 553 formed of the p-type material. In one embodiment of the present invention, the vertical single crystalline body region will have a vertical length of less than 100 nm. The structure is now as shown in FIG. 5C or 5D. As one of ordinary skill in the art will understand upon reading this disclosure. A conventional gate insulator can be grown or deposited on this ultrathin single crystalline film 546. And, either horizontal or vertical gate structures can be formed in trenches 530.

As one of ordinary skill in the art will understand upon reading this disclosure, drain and source regions, 551 and 552 respectively, have been formed in an ultrathin single crystalline film 546 to form a portion of the ultra thin single crystalline vertical transistors, or ultra thin body transistors, according to the teachings of the present invention. The ultrathin single crystalline film 546 now includes an ultra thin single crystalline vertical first source/drain region 551 coupled to the first contact layer 512 and an ultra thin single crystalline vertical second source/drain region 552 coupled to the second contact layer 516. An ultra thin p-type single crystalline vertical body region 553 remains along side of, or opposite, the oxide layer 514 and couples the first source/ drain region 551 to the second source/drain region 552. In effect, the ultra thin p-type single crystalline vertical body region 553 separates the drain and source regions, 551 and 552 respectively, and can electrically couple the drain and source regions, 551 and 552, when a channel is formed therein by an applied potential. The drain and source regions, 551 and 552 respectively, and the ultra thin body region 553 are formed of single crystalline material by the lateral solid phase epitaxial regrowth which occurs in the annealing step.

The dimensions of the structure now include an ultra thin single crystalline body region 553 having a vertical length of less than 100 nm in which a channel having a vertical length of less than 100 nm can be formed. Also, the dimensions include drain and source regions, 551 and 552 respectively, having a junction depth defined by the horizontal thickness of the ultrathin single crystalline film 546, e.g. less than 10 nm. Thus, the invention has provided junction depths which are much less than the channel length of the device and which are scalable as design rules further shrink. Further, the invention has provided a structure for transistors with ultra thin bodies so that a surface space charge region in the body of the transistor scales down as other transistor dimensions scale down. In effect, the surface space charge region has been minimized by physically making the body region of the MOSFET ultra thin, e.g. 10 nm or less.

One of ordinary skill in the art will further understand upon reading this disclosure that the conductivity types described herein can be reversed by altering doping types such that the present invention is equally applicable to include structures having ultra thin vertically oriented single crystalline p-channel type transistors. The invention is not so limited. From the process descriptions described above, the fabrication process can continue to form a number of different horizontal and vertical gate structure embodiments in the trenches 530 as described in connection with the Figures below.

Figure 6A:
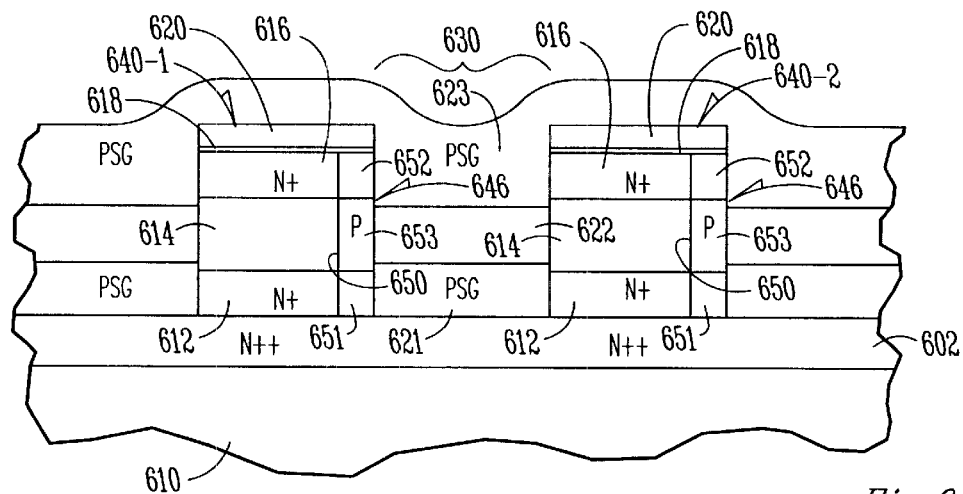
FIGS. 6A–6C illustrate a process sequence for forming a horizontal gate structure embodiment, referred to herein as horizontal replacement gates, in connection with the present invention.
Figure 6B:
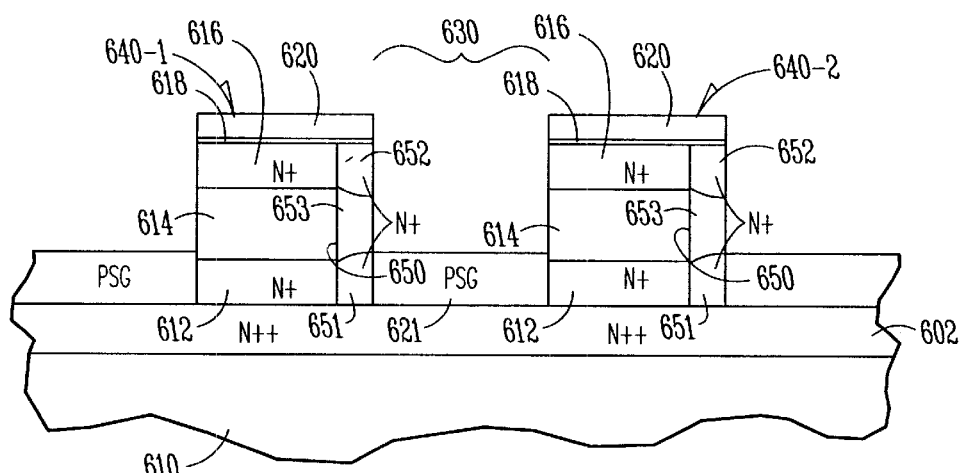
Figure 6C:
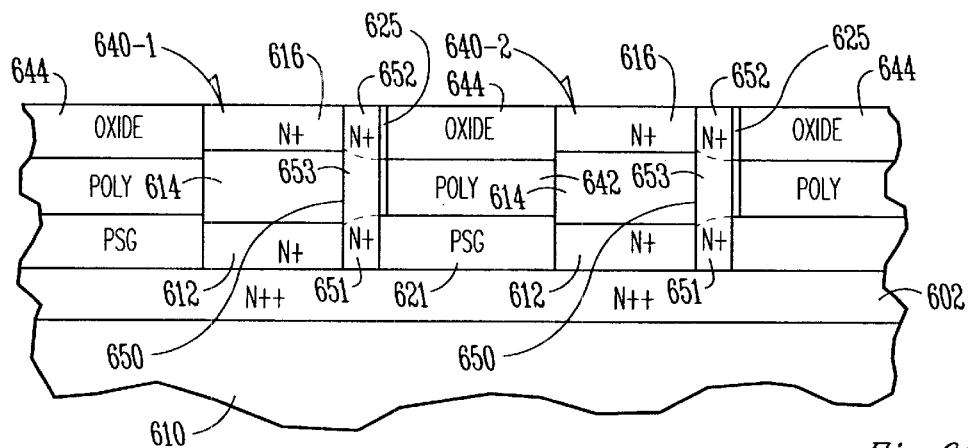

FIGS. 6A–6C illustrate a process sequence for forming a horizontal gate structure embodiment, referred to herein as horizontal replacement gates, in connection with the present invention. The dimensions suggested in the following process steps are appropriate to a 0.1 micrometer CD technology and may be scaled accordingly for other CD sizes. FIG. 6A represents a structure similar to that shown in FIG. 5C. That is FIG. 6A shows an ultrathin single crystalline film 646 along the sidewalls 650 of pillars 640-1 and 640-2 in trenches 630. The ultrathin single crystalline film 646 at this point includes an ultra thin single crystalline vertical first source/drain region 651 coupled to a first contact layer 612 and an ultra thin single crystalline vertical second source/drain region 652 coupled to a second contact layer 616. An ultra thin p-type single crystalline vertical body region 653 is present along side of, or opposite, an oxide layer 614 and couples the first source/drain region 651 to the second source/drain region 652. According to the process embodiment shown in FIG. 6A an n+ doped oxide layer 621, or PSG layer as the same will be known and understood by one of ordinary skill in the art will understand, is deposited over the pillars 640-1 and 640-2 such as by a CVD technique. This n+ doped oxide layer 621 is then planarized to remove off of the top surface of the pillars 640-1 and 640-2. An etch process is performed to leave about 50 nm at the bottom of trench 630. Next, an undoped polysilicon layer 622 or undoped oxide layer 622 is deposited over the pillars 640-1 and 640-2 and CMP planarized to again remove from the top surface of the pillars 640-1 and 640-2. Then, the undoped polysilicon layer 622 is etched, such as by RIE to leave a thickness of 100 nm or less in the trench 630 along side of, or opposite oxide layer 614. Next, another n+ doped oxide layer 623, or PSG layer as the same will be known and understood by one of ordinary skill in the art will understand, is deposited over the pillars 640-1 and 640-2 such as by a CVD process. The structure is now as appears in FIG. 6A.

FIG. 6B illustrates the structure following the next sequence of fabrication steps. In FIG. 6B, a heat treatment is applied to diffuse the n-type dopant out of the PSG layers, e.g. 621 and 623 respectively, into the vertical ultrathin single crystalline film 646 to additionally form the drain and source regions, 651 and 652 respectively. Next, as shown in FIG. 6B, a selective etch is performed, as the same will be known and understood by one of ordinary skill in the art upon reading this disclosure, to remove the top PSG layer 623 and the undoped polysilicon layer 622, or oxide layer 622 in the trench 630. The structure is now as appears in FIG. 6B.

Next, in FIG. 6C, a thin gate oxide 625 is grown as the same will be known and understood by one of ordinary skill in the art, such as by thermal oxidation, for the ultra thin single crystalline vertical transistors, or ultra thin body transistors on the surface of the ultra thin single crystalline vertical body region 653 for those transistors in alternating, row adjacent pillars which will be connected to trench conductor lines for completing the programmable logic array. Next, a doped n+ type polysilicon layer 642 can be deposited to form a gate 642 for the ultra thin single crystalline vertical transistors, or ultra thin body transistors. The structure then undergoes a CMP process to remove the doped n+ type polysilicon layer 642 from the top surface of the pillars 640-1 and 640-2 and RIE etched to form the desired thickness of the gate 642 for the ultra thin single crystalline vertical transistors, or ultra thin body transistors. In one embodiment, the doped n+ type polysilicon layer 642 is RIE etched to form an integrally formed, horizontally oriented word line/gate having a vertical side of less than 100 nanometers opposing the ultra thin single crystalline vertical body region 653. Next, an oxide layer 644 is deposited such as by a CVD process and planarized by a CMP process to fill trenches 630. An etch process is performed, as according to the techniques described above to strip the nitride layer 620 from the structure. This can include a phosphoric etch process using phosphoric acid. The structure is now as appears as is shown in FIG. 6C.

As one of ordinary skill in the art will understand upon reading this disclosure, contacts can be formed to the second contact layer 616 on top of the pillars 640-1 and 640-2 to continue with capacitor formation and standard BEOL processes.

Figure 7A:
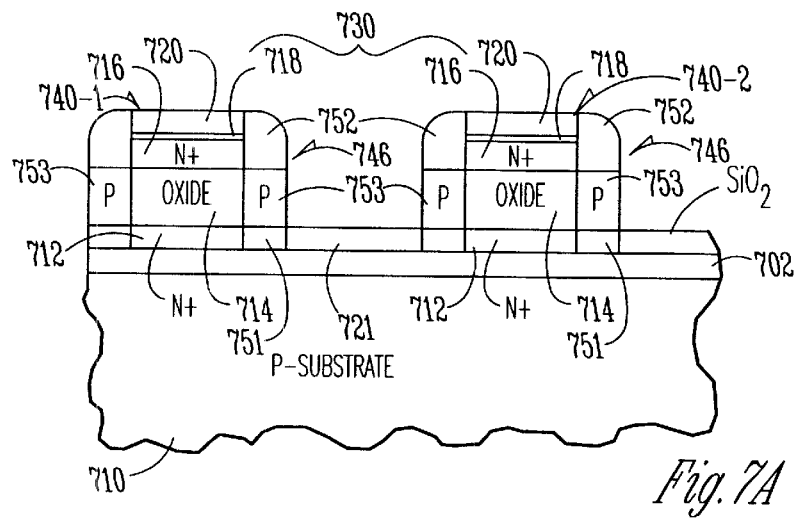
FIGS. 7A–7D illustrate a process sequence for forming a vertical gate structure embodiment, in connection with the present invention.

FIGS. 7A–7D illustrate a process sequence for forming a vertical gate structure embodiment according to the teachings of the present invention. The dimensions suggested in the following process steps are appropriate to a 0.1 micrometer CD technology and may be scaled accordingly for other CD sizes. FIG. 7A represents a structure similar to that shown in FIG. 5C. That is FIG. 7A shows an ultrathin single crystalline film 746 along the sidewalls 750 of pillars 740-1 and 740-2 in trenches 730. The ultrathin single crystalline film 746 at this point includes an ultra thin single crystalline vertical first source/drain region 751 coupled to a first contact layer 712 and an ultra thin single crystalline vertical second source/drain region 752 coupled to a second contact layer 716. An ultra thin p-type single crystalline vertical body region 753 is present along side of, or opposite, an oxide layer 714 and couples the first source/drain region 751 to the second source/drain region 752. According to the process embodiment shown in FIG. 7A, a conformal nitride layer of approximately 20 nm is deposited, such as by CVD, and directionally etched to leave only on the sidewalls 750. A oxide layer is then grown, such as by thermal oxidation, to a thickness of approximately 50 nm in order to insulate the exposed bit line bars 702. The conformal nitride layer on the sidewalls 750 prevents oxidation along the ultrathin single crystalline film 746. The nitride layer is then stripped, using conventional stripping processes as the same will be known and understood by one of ordinary skill in the art. The structure is now as appears in FIG. 7A.

Figure 7B:
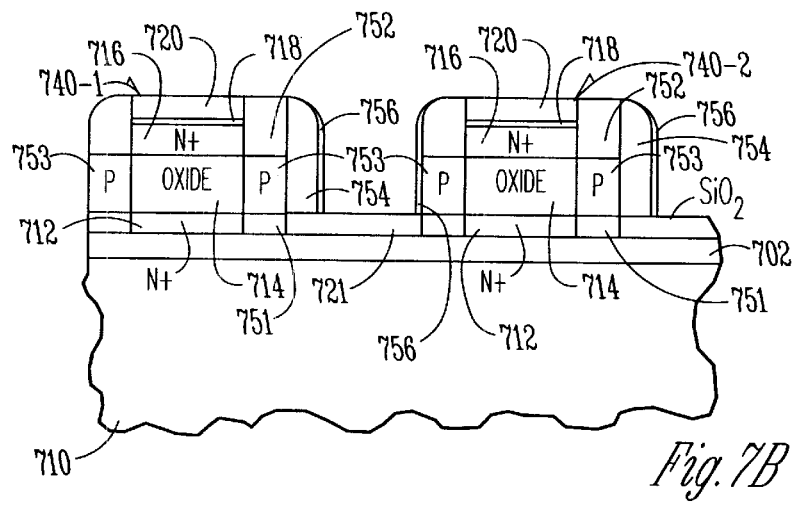

As shown in FIG. 7B, an intrinsic polysilicon layer 754 is deposited over the pillars 740-1 and 740-2 and in trenches 730 and then directionally etched to leave the intrinsic polysilicon layer 754 only on the vertical sidewalls of the pillars 740-1 and 740-2. A photoresist is applied and masked to expose pillar sides where device channels are to be formed, e.g. integrally formed wordline/gates on alternating, row adjacent pillars. In these locations, the intrinsic polysilicon layer 754 is selectively etched, as the same will be known and understood by one of ordinary skill in the art, to remove the exposed intrinsic polysilicon layer 754. Next, a thin gate oxide layer 756 is grown on the exposed sidewalls of the ultrathin single crystalline film 746 for the ultra thin single crystalline vertical transistors, or ultra thin body transistors. The structure is now as appears in FIG. 7B.

Figure 7C:
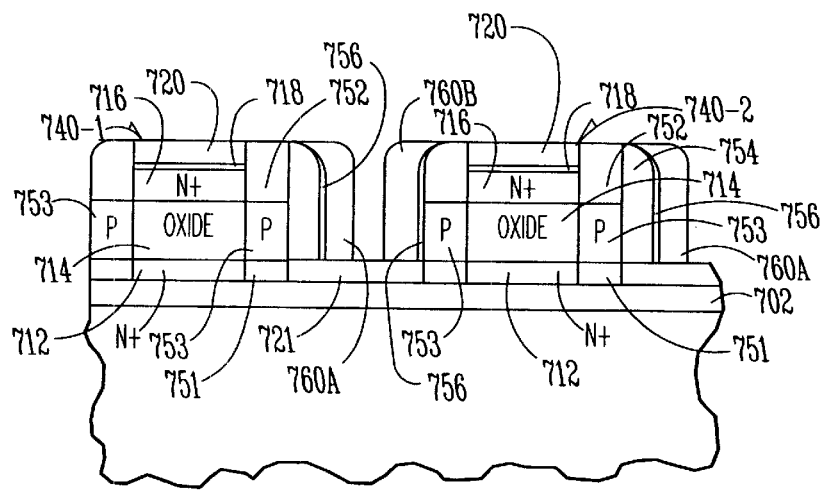

In FIG. 7C, a wordline conductor of an n+ doped polysilicon material or suitable metal 750 is deposited, such as by CVD, to a thickness of approximately 50 nm or less. This wordline conductor 750 is then directionally etched to leave only on the vertical sidewalls of the pillars, including on the thin gate oxide layers 756 of alternating, row adjacent pillars in order to form separate vertical, integrally formed wordline/gates 760A and 760B. The structure is now as appears in FIG. 7C.

Figure 7D:
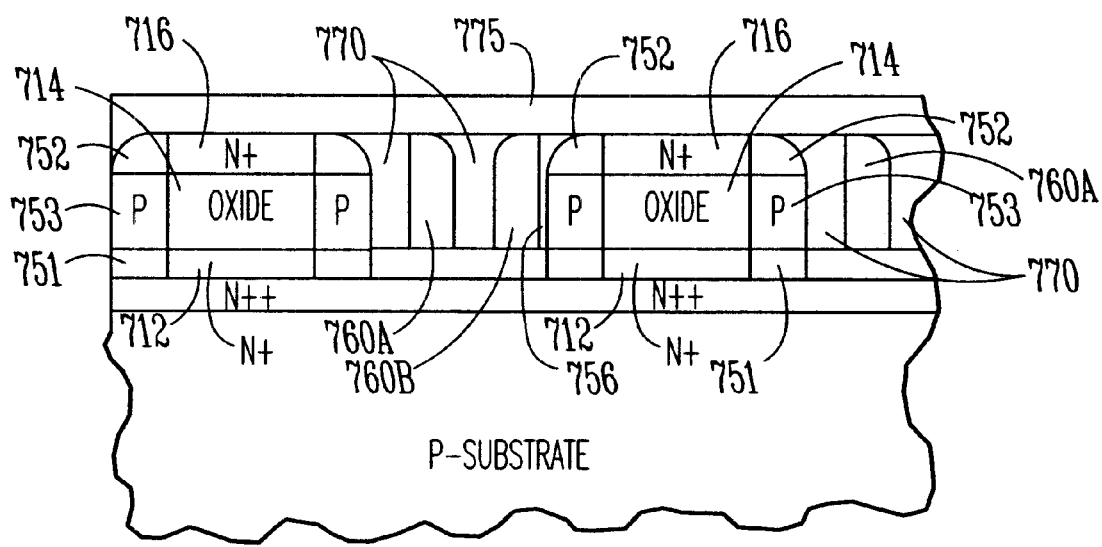

In FIG. 7D, a brief oxide etch is performed to expose the top of the remaining intrinsic polysilicon layer 754. Then, a selective isotropic etch is performed, as the same will be known and understood by one of ordinary skill in the art, in order to remove all of the remaining intrinsic polysilicon layer 754. An oxide layer 770 is deposited, such as by CVD, in order to fill the cavities left by removal of the intrinsic polysilicon layer and the spaces in the trenches 730 between the separate vertical wordlines 760A and 760B neighboring pillars 740-1 and 740-2. As mentioned above, the separate vertical wordlines will integrally form gates on alternating, row adjacent pillars. The oxide layer 770 is planarized by CMP to remove from the top of the pillars 740-1 and 740-2 stopping on the nitride pad 720. a Then the remaining pad material 718 and 720 is etched, such as by RIE, to remove from the top of the pillars 740-1 and 740-2. Next, deposit CVD oxide 775 to cover the surface of the pillars 740-1 and 740-2. The structure is now as appears in FIG. 7D.

As one of ordinary skill in the art will understand upon reading this disclosure, the process can now proceed with storage capacitor formation and BEOL process steps.

As one of ordinary skill in the art will understand upon reading this disclosure, the process steps described above produce integrally formed vertically oriented wordlines 760A and 760B which serve as integrally formed vertical gates along the sides of alternating, row adjacent pillars.

Figure 8:
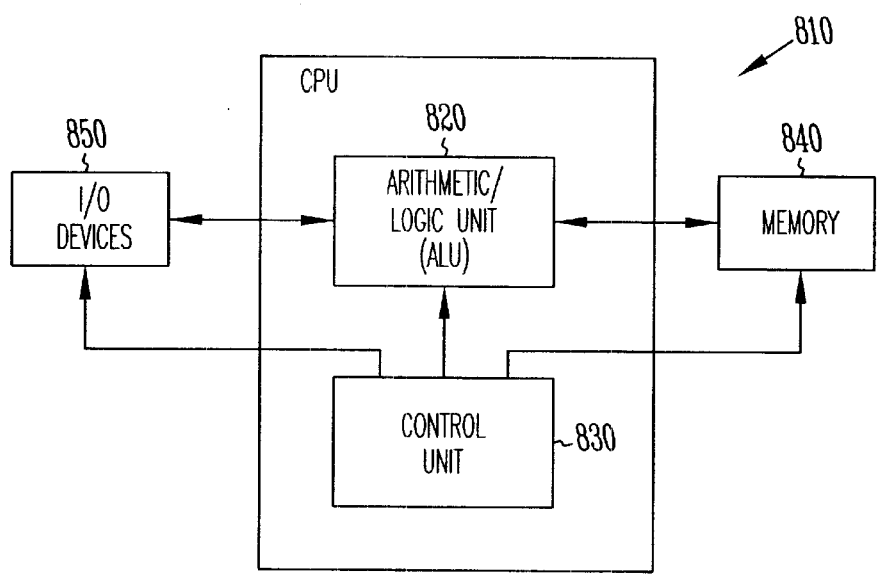
FIG. 8 is a block diagram of a high-level organization of a digital computer including one or more programmable logic arrays formed with vertical ultra thin body transistor according to the teachings of the present invention.

FIG. 8 is a block diagram of a high-level organization of a digital computer 800. A digital computer 800 is a system whose functional elements consist of an arithmetic/logic unit (ALUs) 820, a control unit 830, a memory unit 840 and an input/output (I/O) device 850. Every computer system has a native set of instructions that specify operations to be performed on data by the ALU 820 and other interactions between the ALU 820, the memory unit 840 and the I/O devices 850. The memory units 840 contain the data plus a stored list of instructions.

The control unit 830 coordinates all operations of the ALU 820, the memory unit 840 and the I/O devices 850 by continuously cycling through a set of operations that cause instructions to be fetched from the memory unit 840 and executed. Many of the logic functions performed by these components can include a programmable logic array with ultra thin single crystalline vertical transistors according to the teachings of the present invention. With respect to the ALU 820, the control unit 830 and the I/O devices 850, arbitrary logic functions may be realized in the "sum-of-products" form. A logic function sum-of-products may be implemented using any of the equivalent two-level logic configurations: AND-OR, NAND-NAND, NOR-OR, OR-NOR, AND-NOR, NAND-AND or OR-AND.

Figure 9:
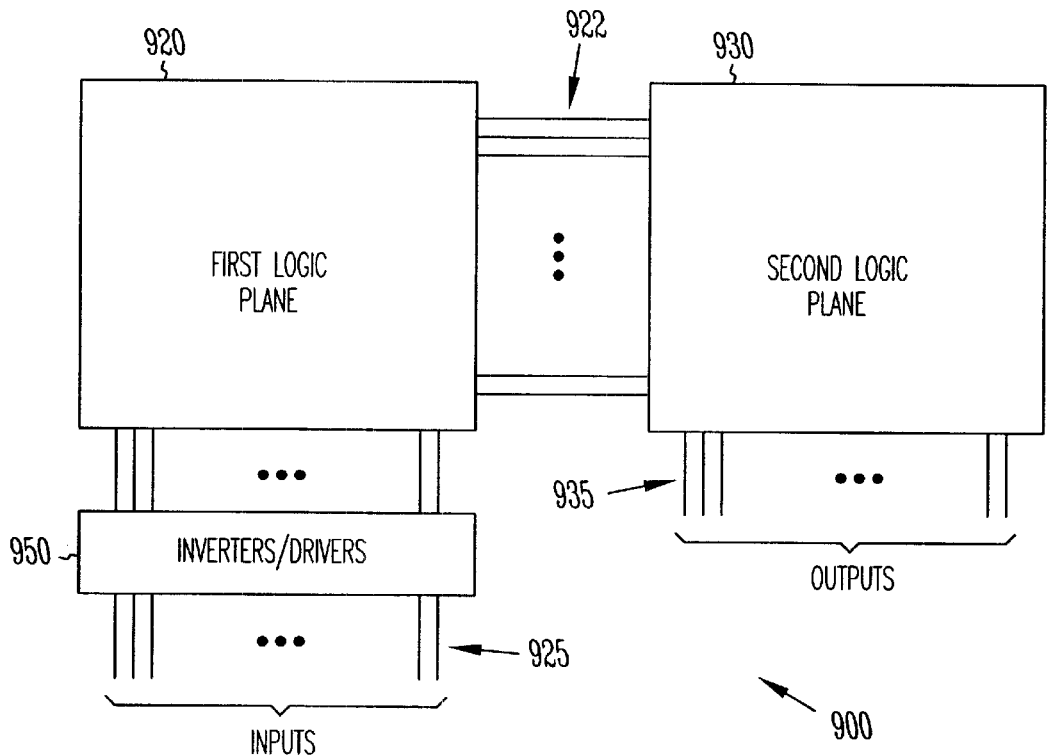
FIG. 9 is a block diagram of an embodiment of a programmable logic array according to the teachings of the present invention.

FIG. 9 is a diagram of a programmable logic array (PLA), indicated generally at 900, and constructed according to the teachings of the present invention. PLA 900 includes two major constituents: a first logic plane 920 and a second logic plane 930. The first and second logic planes 920 and 930 are formed using an array of vertical transistors. In one embodiment, the first and second logic planes 920 and 930 each comprise NOR logic circuits such that PLA 100 implements NOR-NOR logic. In other embodiments, first and second logic planes 920 and 930 are constructed. from arrays of ultra thin single crystalline vertical transistors that are configured to implement AND-OR, OR-AND, NAND-NAND, NOR-OR, OR-NOR, AND-NOR, and NAND-AND logic.

Input lines 925 are coupled to receive a number of input signals. Inverters/drivers 950 are coupled to the input lines 925 such that first logic plane 920 is capable of receiving each of the input signals and their complements. First logic plane 920 produces a number of output signals that are logical combinations of the signals from inverters/drivers 950. The output signals from first logic plane 920 are provided to second logic plane 930 via interconnection lines 922. Second logic plane 930 produces a number of output signals that are logical combinations of the signals from interconnection lines 922.

In addition, various control circuits and signals not detailed herein initiate and synchronize the PLA 900 operation as known to those skilled in the art. The PLA 900 implementation described with respect to FIG. 9 is illustrative only and is not intended to be exclusive or limiting.

Figure 10:
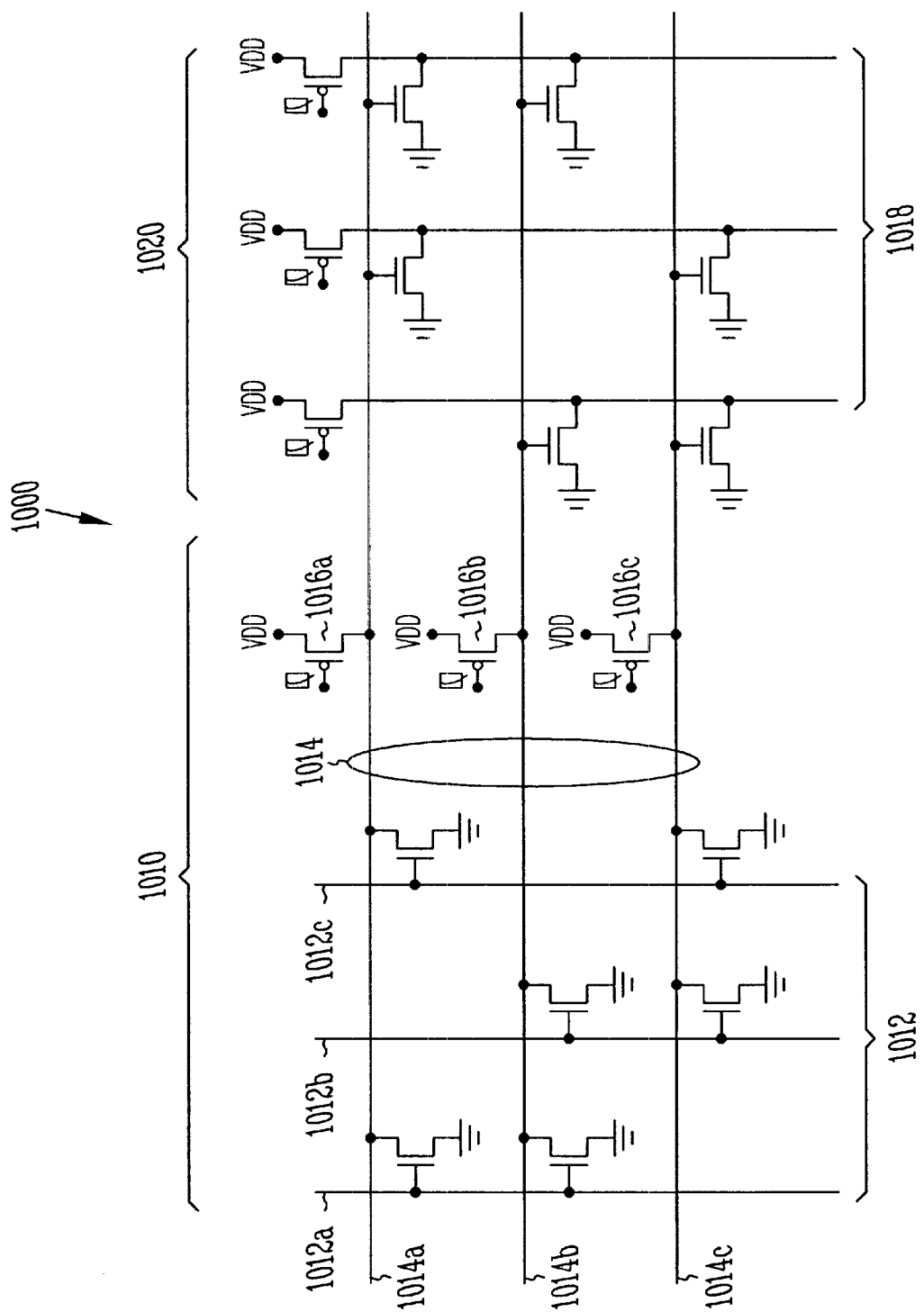
FIG. 10 is a schematic diagram illustrating generally an architecture of one embodiment of a programmable logic array according to the teachings of the present invention.

FIG. 10 is a schematic diagram illustrating generally an architecture of one embodiment of a programmable logic array (PLA), indicated generally at 1000, and constructed according to the teachings of the present invention. PLA 1000 implements an illustrative logical function using a two level logic approach. Specifically, PLA 1000 includes first and second logic planes 1010 and 1020. In this example, the logic function is implemented using NOR-NOR logic. First and second logic planes 1010 and 1020 each include an array of ultra thin single crystalline vertical transistors that are configured to implement the logical function of PLA 1000.

It is noted that the configuration of FIG. 10 is provided by way of example and not by way of limitation. Specifically, the teachings of the present application are not limited to programmable logic arrays in the NOR-NOR approach. Further, the teachings of the present application are not limited to the specific logical function shown in FIG. 10. Other logical functions can be implemented in a programmable logic array with ultra thin single crystalline vertical transistors using any one of the various two level logic approaches.

First logic plane 1010 receives a number of input signals at input lines 1012. In this example, no inverters are provided for generating complements of the input signals. However, first logic plane 1010 can include inverters to produce the complementary signals when needed in a specific application.

First logic plane 1010 includes a number of ultra thin single crystalline vertical transistors that form an array. The ultra thin single crystalline vertical transistors are located at the intersection of input lines 1012 and interconnect lines 1014. Not all of the ultra thin single crystalline vertical transistors are operatively connected in the first logic plane. Rather, the ultra thin single crystalline vertical transistors are selectively coupled to the input and interconnection lines so as to implement a desired logic function. Thus, some transistors are left unconnected. This selective interconnection is referred to as "mask programming" since the logical function implemented by the programmable logic array is "programmed" into the array by masking steps that are used in the generation of the conductors that interconnect the ultra thin single crystalline vertical transistors in the array.

In this embodiment, each of the interconnect lines 1014 acts as a NOR gate for the input lines 1012 that are connected to the interconnect lines 1014 through the ultra thin single crystalline vertical transistors of the array. For example, interconnection line 1014a acts as a NOR gate for the signals on input lines 1012a and 1012c. That is, p-channel pull up transistor 1016a maintains interconnect line 1014a at a high potential unless one or more of the ultra thin single crystalline vertical transistors that are coupled to interconnect line 1014a are turned on by a high logic level signal on an input line.

In a similar manner, second logic plane 1020 comprises a second array of ultra thin single crystalline vertical transistors that are selectively interconnected to provide the second level of the two level logic needed to implement a specific logical function. In this embodiment, the array of transistors is also configured such that the output lines 1018 comprise a logical NOR function of the signals from the interconnection lines 1014 that are coupled to particular output lines through the ultra thin single crystalline vertical transistors of the second logic plane 1020.

Figure 11A:
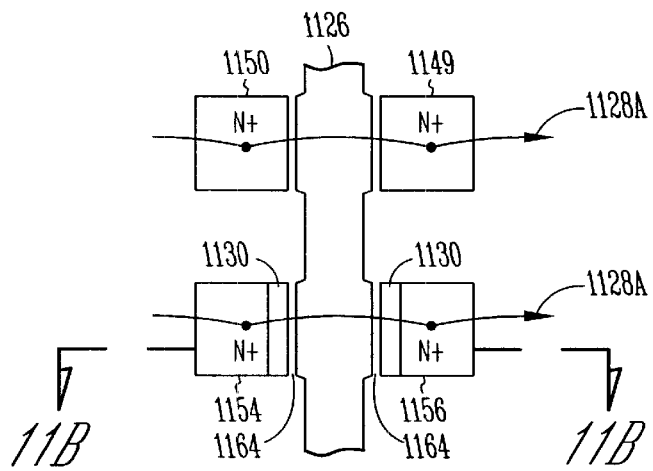
FIGS. 11A and 11B are top and front views of a portion of an embodiment of the programmable logic array of FIG. 10 showing horizontal replacement gates and ultra thin single crystalline vertical transistors along some sides of the pillars described above.
Figure 11B:
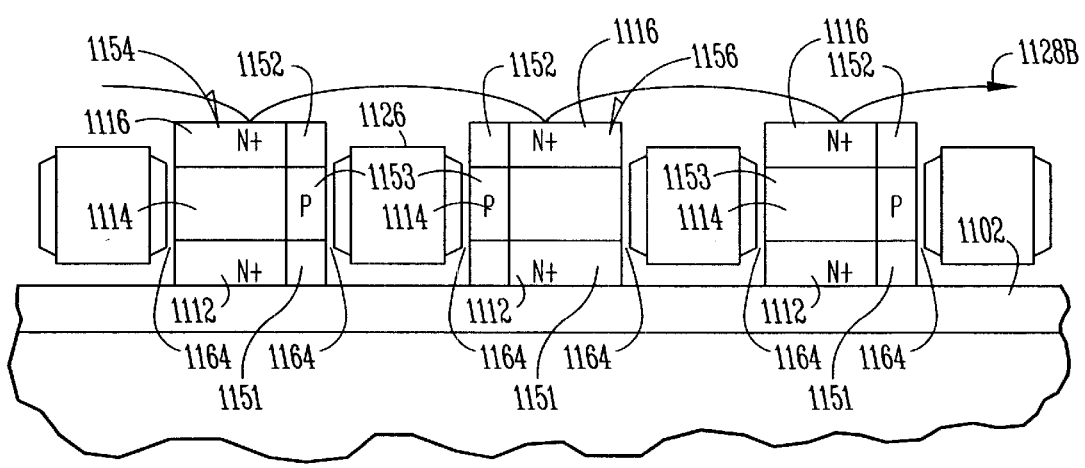

FIGS. 11A and 11B are top and front views of a portion of an embodiment of the programmable logic array 1000 of FIG. 10 showing horizontal gates, as the same have been described herein, and ultra thin single crystalline vertical transistors along some sides of the pillars described above. The portion of the embodiment can represent rows and columns of pillars, some having transistors formed alongside thereof according to the teachings of the present invention, in either the first logic plane 1010 or the second logic plane 1020 from FIG. 10. The discussion which immediately follows references rows and columns of pillars in the first logic plane 1010. In this embodiment, each of the input lines, 1012 from FIG. 10, is formed in a trench that separates rows of ultra thin single crystalline vertical transistors. For example, FIGS. 11A and 11B illustrate a conductive line 1126 which is housed in a trench that separates pillars 1150 and 1149, from pillars 1154 and 1156. In this embodiment, the conductive line represents an input line 1126 to the programmable logic array 1000 of FIG. 10. The electrical operation of the programmable logic array 1000 will be understood by one of ordinary skill in the art in viewing these figures. FIG. 11A illustrates that there may or may not be an ultra thin single crystalline vertical transistor 1130 on a particular side of the pillars and likewise there may or may not be an ultra thin single crystalline vertical transistor 1130 on the other side of the pillar adjacent any given trench. If there is not an ultrathin body transistor then the gate/input line 1126 just bypasses the pillar. Transistors can be formed both on the front and back of the pillars, in this case the back gate can be or can not be biased at the same time as the front polysilicon gate is biased. Note that in this case the back gate line is equivalent to the front gate in that it has the same structure as the gate for the transistor on the front of the pillar. There is thus no physical distinction between the front gate and the back gate. In this particular embodiment, the ultra thin single crystalline vertical body region of the ultra thin single crystalline vertical transistor is floating and filly depleted. The channels of the vertical devices are formed in the ultra thin single crystalline vertical transistor as described above. Input lines 1126 which gate the ultra thin single crystalline vertical transistors are formed by CVD deposition of either metal or poly silicon as described above. Contacts to the top-side metal address word lines used in the memory array can be made by using the conventional methods of contact hole etching.

In the embodiment shown in FIG. 11A, input line 1126 passes between pillars 1154 and 1156. Input line 1126 is separated from the ultra thin single crystalline vertical body region of the ultra thin single crystalline vertical transistors along side of pillars 1154 and 1156 by gate insulator 1164.

FIG. 11B shows a cross sectional view taken along cut line 11B in FIG. 11A. As described above, the ultra thin single crystalline vertical second source/drain region 1152 is coupled to a second contact layer 1116 in pillar 1154. The second contact layer 1116 is coupled to interconnect line 1128B. The interconnect line 1128B is similarly coupled to the second contact layer 1116 in column adjacent pillars, e.g. 1156. In this manner, pillars 1154 and 1156 combine to provide the function of the first logic plane 1010 in FIG. 10. When a high logic level is applied to input line 1126, inversion layers are formed within the ultra thin single crystalline vertical body regions, e.g. 1153, of pillars 1154 and 1156 such that the pillars operate as metal-oxide-semiconductor field-effect transistors (MOSFET). By turning on these transistors, the interconnect line 1128B is brought to ground potential. Otherwise, when input line 1126 is grounded, the transistors are off and the interconnect line 1128B is allowed to maintain a high logic level, unaffected by the transistors.

As mentioned above, in the embodiment of FIGS. 11A and 11B not all of the pillars of PLA 1000 have an ultra thin single crystalline vertical transistor along side of the pillar which are coupled with input lines 1126. Some of the pillars are selectively left unused so as to implement a desired logical function. For example, pillars 1150 and 1149 are located at the intersection of input line 1126 and interconnect line 1128A. As shown in FIG. 11A, no transistor is required at this intersection in this embodiment. Thus, input line 1126 is a passing line between pillars 1150 and 1149.

In this embodiment, two pillars are used for each transistor in PLA 1000. Advantageously, this provides for redundancy in the performance of the logical function. If one of the pillars is defective or does not operate properly, the other pillar can continue to perform the logical operation. The cost of this redundancy is a decrease in circuit density because of the use of two pillars to perform the function of a single transistor.

As one of ordinary skill in the art will understand upon reading this disclosure, the portion of the embodiment of the programmable logic array 1000 of FIG. 10 represented in FIGS. 11A and 11B can equally represent a portion of the rows and columns of pillars in the second logic plane 1020 showing horizontal gates, as the same have been described herein, and ultra thin single crystalline vertical transistors along some sides of the pillars described above. In this embodiment, it is then an interconnect line 1126 which is located between pillars 1154 and 1156. As before, in this embodiment, the ultra thin single crystalline vertical second source/drain region 1152 is coupled to a second contact layer 1116 in pillar 1154. However, in the second contact plane 1020 the second contact layer 1116 for pillar 1154 is coupled to an output line 1128B. The output line 1128B is similarly coupled to the second contact layer 1116 in column adjacent pillars, e.g. 1156. In this manner, pillars 1154 and 1156 combine to provide the function of the second logic plane 1020 in FIG. 10. When a high logic level is applied to interconnect line 1126, inversion layers are formed within the ultra thin single crystalline vertical body regions, e.g. 1153, of pillars 1154 and 1156 such that the pillars operate as metal-oxide-semiconductor field-effect transistors (MOSFET). By turning on these transistors, the output line 1128B is brought to ground potential. Otherwise, when interconnect line 1126 is grounded, the transistors are off and the output line 1128 is allowed to maintain a high logic level, unaffected by the transistors.

As mentioned above, in the embodiment of FIGS. 11A and 11B representing the second logic plane 1020 not all of the pillars of PLA 1000 have an ultra thin single crystalline vertical transistor along side of the pillar which are coupled with interconnect lines 1126. Some of the pillars are selectively left unused so as to implement a desired logical function. For example, pillars 1150 and 1149 are located at the intersection of interconnect line 1126 and output line 1128A. In this embodiment of FIG. 11A representing a portion of the second logic plane 1020, no transistor is required at this intersection. Thus, interconnect line 1126 is a passing line between pillars 1150 and 1149.

Figure 12A:
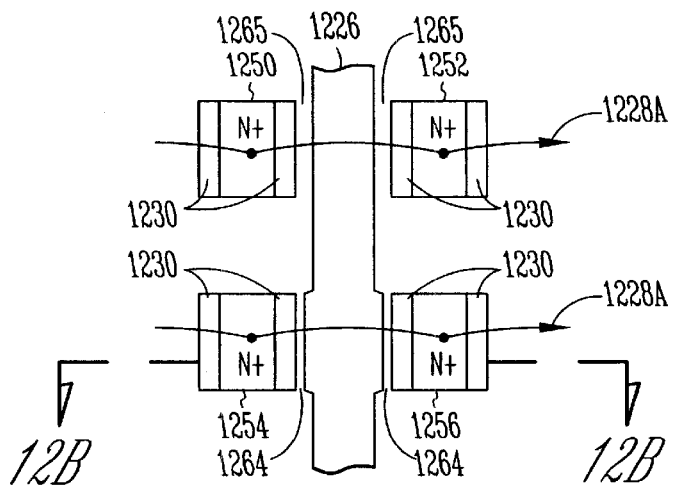
FIGS. 12A and 12B are top and front views of a portion of an embodiment of the programmable logic array of FIG. 10 showing horizontal replacement gates and ultra thin single crystalline vertical transistors along both sides of each pillar described above.
Figure 12B:
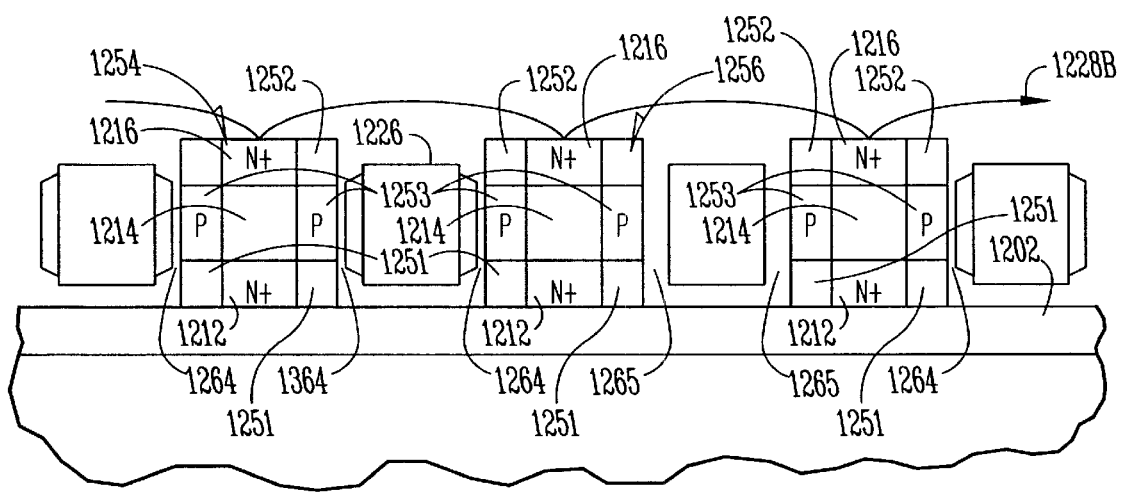

FIGS. 12A and 12B are top and front views of a portion of an embodiment of PLA 1000 of FIG. 10 showing horizontal gates, as the same has been described herein, and ultra thin single crystalline vertical transistors along both sides of each pillar described above. The portion of the embodiment can represent rows and columns of pillars in either the first logic plane 1010 or the second logic plane 1020 from FIG. 10. The discussion which immediately follows references rows and columns of pillars in the first logic plane 1010. In this embodiment, each of the input lines, 1012 from FIG. 10, is formed in a trench that separates rows of ultra thin single crystalline vertical transistors. For example, FIGS. 12A and 12B illustrate a conductive line 1226 which is housed in a trench that separates pillars 1250 and 1254, from pillars 1249 and 1256. In this embodiment, the conductive line represents an input line 1226 to the programmable logic array 1000 of FIG. 10. The electrical operation of the PLA circuit 1000 will be understood by one of ordinary skill in the art in viewing these figures. FIG. 12A illustrates that there may or may not be an ultra thin gate oxide 1264 separating the single crystalline vertical transistor 1230 on a particular side of the pillars and likewise there may or may not be an ultra thin gate oxide 1264 separating the single crystalline vertical transistor 1230 on the other side of the pillar. If there is not an ultra thin gate oxide 1264 then the gate/input line 1226 just bypasses the pillar. As shown in FIGS. 12A and 12B, input line 1226 is a passing line between pillars 1250 and 1249 with sufficient spacing, e.g. a thick oxide 1265 as described in connection with FIG. 7, from the pillars such that an inversion layer does not form in either pillar when a high voltage is applied to input line 1226. That is, the insulator, or thick oxide layer 1265 that separates pillars 1250 and 1249 from input line 1226 creates a transistor with a threshold voltage that is sufficiently high so as to exceed the most positive gate voltage to be applied to the input line 1226 in the first logic plane 1010 of PLA 1000 such that the transistor will never turn on.

FIG. 12B shows a cross sectional view taken along cut line 12B in FIG. 12A. As described above, the ultra thin single crystalline vertical second source/drain region 1252 is coupled to a second contact layer 1216 in pillar 1254. The second contact layer 1216 is coupled to interconnect line 1228B. The interconnect line 1228B is similarly coupled to the second contact layer 1216 in column adjacent pillars, e.g. 1256. In this manner, pillars 1254 and 1256 combine to provide the function of the first logic plane 1010 in PLA 1000 in FIG. 10. When a high logic level is applied to input line 1226, inversion layers are formed within the ultra thin single crystalline vertical body regions, e.g. 1253, of pillars 1254 and 1256 such that the pillars operate as metal-oxide-semiconductor field-effect transistors (MOSFET). By turning on these transistors, the interconnect line 1228B is brought to ground potential. Otherwise, when input line 1226 is grounded, the transistors are off and the interconnect line 1228B is allowed to maintain a high logic level, unaffected by the transistors.

As one of ordinary skill in the art will understand upon reading this disclosure, the portion of the embodiment of the programmable logic array 1000 of FIG. 10 represented in FIGS. 12A and 12B can equally represent a portion of the second logic plane 1020 showing horizontal gates, as the same have been described herein, and ultra thin single crystalline vertical transistors along both sides of each of the pillars described above. In this embodiment, it is then an interconnect line 1226 which is located between pillars 1254 and 1256. As before, in this embodiment, the ultra thin single crystalline vertical second source/drain region 1252 is coupled to a second contact layer 1216 in pillar 1254. However, in the second contact plane 1020 the second contact layer 1216 of pillar 1254 is coupled to an output line 1228B. The output line 1228B is similarly coupled to the second contact layer 1216 in column adjacent pillars, e.g. 1256. In this manner, pillars 1254 and 1256 combine to provide the function of the second logic plane 1020 in FIG. 10. When a high logic level is applied to interconnect line 1226, inversion layers are formed within the ultra thin single crystalline vertical body regions, e.g. 1253, of pillars 1254 and 1256 such that the ultra thin single crystalline vertical transistors along side of these pillars operate as metal-oxide-semiconductor field-effect transistors (MOSFET). By turning on these transistors, the output line 1228B is brought to ground potential. Otherwise, when interconnect line 1226 is grounded, the transistors are off and the output line 1228B is allowed to maintain a high logic level, unaffected by the transistors.

As mentioned above, in the embodiment of FIGS. 12A and 12B representing the second logic plane 1020 not all of the pillars of PLA 1000 have an ultra thin gate oxide 1264 separating the ultra thin single crystalline vertical transistor along side of the pillar from the interconnect lines 1226. Some of the pillars are selectively separated from the interconnect lines 1226 by a thick oxide 1265 such that the ultra thin single crystalline vertical transistor along side of the pillar is left unused so as to implement a desired logical function. For example, pillars 1250 and 1249 are located at the intersection of interconnect line 1226 and output line 1228A. In this embodiment of FIG. 12A representing a portion of the second logic plane 1020, no transistor is required at this intersection. Thus, interconnect line 1226 is a passing line between pillars 1250 and 1249.

Figure 13A:
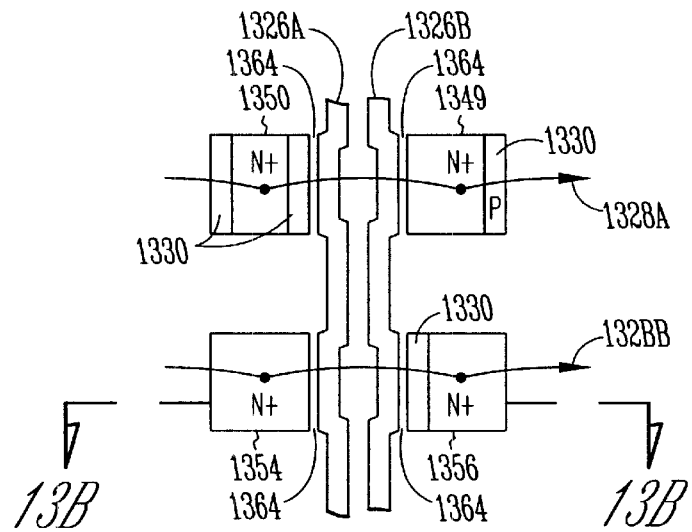
FIGS. 13A–13C are top and front views of a portion of an embodiment of the programmable logic array of FIG. 10 showing a vertical split gate/address line configuration and ultra thin single crystalline vertical transistors along some sides of the pillars described above.
Figure 13B:
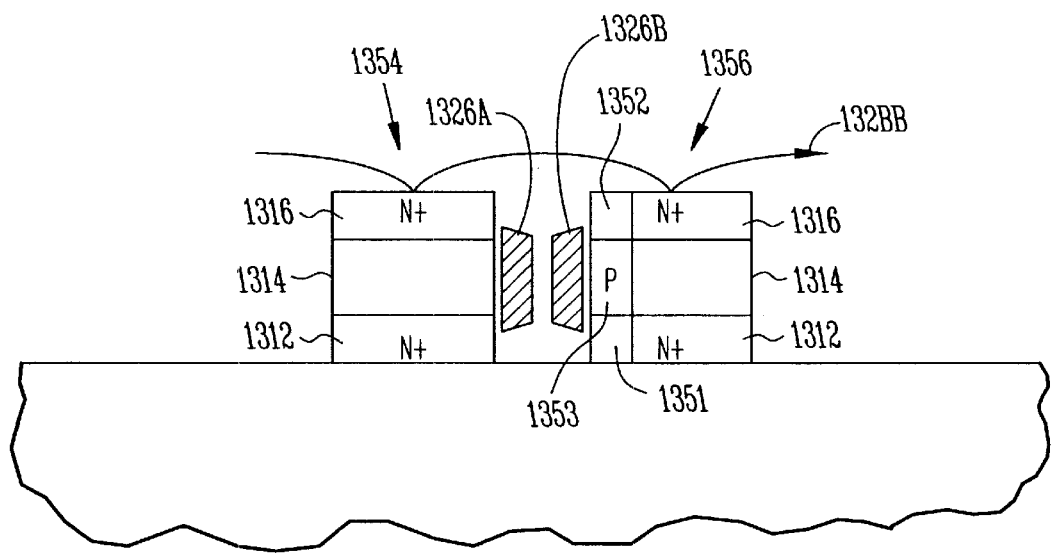

FIGS. 13A and 13B are top and front views of a portion of an embodiment of the first logic plane 1010 in PLA 1000 of FIG. 10 showing a vertical split gate/address line configuration, as the same has been described herein, and ultra thin single crystalline vertical transistors along some sides of the pillars described above. The portion of the embodiment can represent rows and columns of pillars in either the first logic plane 1010 or the second logic plane 1020 from FIG. 10. The discussion which immediately follows references rows and columns of pillars in the first logic plane 1010. In this embodiment, each of the input lines, 1012 from FIG. 10, is formed in a trench that separates rows of ultra thin single crystalline vertical transistors. For example, FIGS. 13A and 13B illustrate a conductive line 1326 which is housed in a trench that separates pillars 1350 and 1354, from pillars 1349 and 1356. In this embodiment, the conductive line represents an input line 1326 to the programmable logic array 1000 of FIG. 10. The electrical operation of this embodiment of the PLA circuit 1000 will be understood by one of ordinary skill in the art in viewing these figures. FIG. 13A illustrates that there may or may not be an ultra thin single crystalline vertical transistor 1330 on a particular side of the pillars and likewise there may or may not be an ultra thin single crystalline vertical transistor 1330 on the other side of the pillar. If there is not an ultrathin body transistor then the gate/input lines 1326A and 1326B just bypasses the pillar. Transistors can be formed both on the front and back of the pillars, in this case the back gate/input line can be or can not be biased at the same time as the front polysilicon gate/input line is biased. Note that in this case the back gate/input line is equivalent to the front gate/input line in that it has the same structure as the gate/input line for the transistor on the front of the pillar. There is thus no physical distinction between the front gate/input line and the back gate/input line. In this particular embodiment, the ultra thin single crystalline vertical body region 1353 of the ultra thin single crystalline vertical transistor is floating and fully depleted. The channels of the vertical devices are formed in the ultra thin single crystalline vertical transistor as described above. Input lines 1326A and 1326B which gate the ultra thin single crystalline vertical transistors are formed by CVD deposition of either metal or poly silicon as described above. Contacts to the top-side metal address word lines used in the memory array can be made by using the conventional methods of contact hole etching.

The input signals on the metal lines will be used to drive the ultra thin single crystalline vertical transistors in first and second logic planes, 1010 and 1020 from FIG. 10, to implement particular logic functions. Contacts and wiring at the metal level can be achieved using conventional techniques.

In the embodiment shown in FIG. 13A, input lines 1326A and 1326B pass between pillars 1354 and 1356. Input lines 1326A and 1326B are separated from the ultra thin single crystalline vertical body region 1353 of the ultra thin single crystalline vertical transistor by a thin gate oxide 1364, where the same are present along the pillars, e.g. along side of pillar 1364.

FIG. 13B shows a cross sectional view taken along cut line 13B in FIG. 13A. As described above, the ultra thin single crystalline vertical second source/drain 1352 region is coupled to a second contact layer 1316 in pillar 1354. The second contact layer 1316 in pillar 1354 is coupled to interconnect line 1328B. The interconnect line 1328B is similarly coupled to the second contact layer 1316 column adjacent pillars, e.g. 1356. In this manner, pillars 1354 and 1356 combine to provide the function of the first logic plane 1010 in PLA 1000 in FIG. 10. When a high logic level is applied to input lines 1326A and 1326B, inversion layers are formed within the adjacent ultra thin single crystalline vertical body regions, e.g. 1353, of pillar 1356 such that the ultra thin single crystalline vertical transistor adjacent this pillar operates as a metal-oxide-semiconductor field-effect transistors (MOSFET). By turning on this transistor, the interconnect line 1328B is brought to ground potential. Otherwise, when input lines 1326A and 1326B are grounded, the transistors are off and the interconnect line 1328B is allowed to maintain a high logic level, unaffected by the transistors.

As mentioned above, in the embodiment of FIGS. 13A and 13B not all of the pillars of PLA 1000 have an ultra thin single crystalline vertical transistor along side of the pillar which are coupled with input lines 1326A and 1326B. Some of the pillars are selectively left unused by not forming an ultra thin single crystalline vertical transistor along side of the pillar so as to implement a desired logical function. For example, pillar 1354 does have an ultra thin single crystalline vertical transistor along side of the pillar at the intersection of input line 1326A and interconnect line 1328B. Pillar 1349 does not have an ultra thin single crystalline vertical transistor along side of the pillar at the intersection of input line 1326B and interconnect line 1328A. As shown in FIG. 13A, no transistor is required at this intersection in this embodiment. Thus, input line 1326A is a passing line for pillar 1354, and input line 1326B is a passing line for pillar 1349.

As one of ordinary skill in the art will understand upon reading this disclosure, the portion of the embodiment of the programmable logic array 1000 of FIG. 10 represented in FIGS. 13A and 13B can equally represent a portion of the second logic plane 1020 showing horizontal replacement gates, as the same have been described herein, and ultra thin single crystalline vertical transistors along some sides of the pillars described above. In this embodiment, it is then a pair of interconnect lines 1326A and 1326B which are located between pillars 1354 and 1356 in the second logic plane 1020. As before, in this embodiment, the ultra thin single crystalline vertical second source/drain region 1352 is coupled to a second contact layer 1316 in pillar 1354. However, in the second logic plane 1020 the second contact layer 1316 of pillar 1354 is coupled to an output line 1328B. The output line 1328B is similarly coupled to the second contact layer 1316 in column adjacent pillars, e.g. 1356. In this manner, pillars 1354 and 1356 combine to provide the function of the second logic plane 1020 in FIG. 10. When a high logic level is applied to interconnect lines 1326A and 1326B, inversion layers are formed within the ultra thin single crystalline vertical body regions, e.g. 1353, of pillar 1350 and 1356 such that the ultra thin single crystalline vertical transistors adjacent these pillars operate as metal-oxide-semiconductor field-effect transistors (MOSFET). By turning on these transistors, the output lines 1328A and 1328B are brought to ground potential. Otherwise, when interconnect lines 1326A and 1326B are grounded, the transistors are off and the output lines 1328A and 1328B are allowed to maintain a high logic level, unaffected by the transistors.

As mentioned above, in the embodiment of FIGS. 13A and 13B representing the second logic plane 1020 not all of the pillars of PLA 1000 have an ultra thin single crystalline vertical transistor along side of the pillar which are coupled with adjacent interconnect lines 1326A and 1326B. Some of the pillars are selectively left unused by not forming an ultra thin single crystalline vertical along side of the pillar so as to implement a desired logical function. For example, pillar 1354 is located at the intersection of interconnect line 1326A and output line 1328B. In this embodiment of FIG. 13A representing a portion of the second logic plane 1020, no transistor is required at this intersection. Thus, interconnect line 1326A is a passing line between pillars 1354 and 1356. Analogously, interconnect line 1326B is a passing line between pillars 1350 and 1349.

Figure 13C:
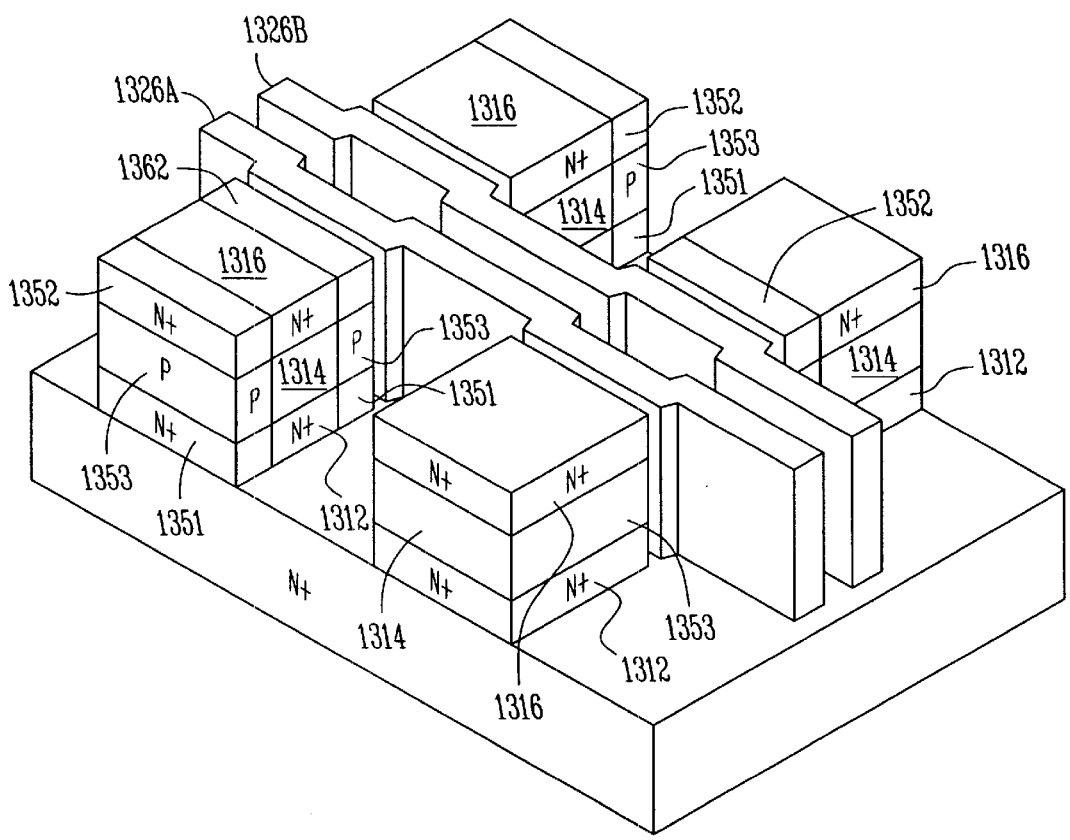

FIG. 13C is a perspective view of this embodiment whether it be in the first of the second logic planes, 1010 and 1020 respectively. In the split gate configuration a much higher density of the PLA 1000 is achieved. The embodiment using split or separate input lines 1326 in the first logic plane 1010, or split interconnect line 1326 in the second logic plane 1020 is also understood in connection with FIGS. 7. These embodiments offer the benefit of substantially reducing the area associated with each device. Here the ultra thin single crystalline vertical transistors in a given row or column in the PLA 1000 have a single gate/input line 1326 in the first logic plane 1010, and a single gate/interconnect line 1326 in the second logic plane 1020 for each input signal or interconnect signal, respectively. None of these input signals on input lines 1326 or interconnect signals on interconnect lines 1326 appear as gate potentials for the ultra thin single crystalline vertical transistors in trench opposing pillars. The split input lines 1326 in the first logic plane 1010, or the split interconnect line 1326 in the second logic plane 1020 can be separated after a single conductive line deposition by performing a directional etch following deposition to leave the conductor on the vertical sidewalls only. The same has been explained in more detail in connection with FIG. 7.

Details of the fabrication can utilize the general techniques which we have described above in the fabrication of the ultra thin single crystalline vertical transistors along side of the pillars in either bulk or SOI technology. As one of ordinary skill in the art will understand upon reading this disclosure, the split input lines 1326 in the first logic plane 1010, or the split interconnect line 1326 in the second logic plane 1020 scheme will be similar to the open bit line address scheme in DRAMs where the address lines are split. The pillars are always gated on both sides, the logic is programmed into the array by determining whether or not there is an ultra thin single crystalline vertical transistor on the side of the pillar adjacent to the split input lines 1326 in the first logic plane 1010, or the split interconnect lines 1326 in the second logic plane 1020 in order to form a transistor 1330.

Figure 14A:
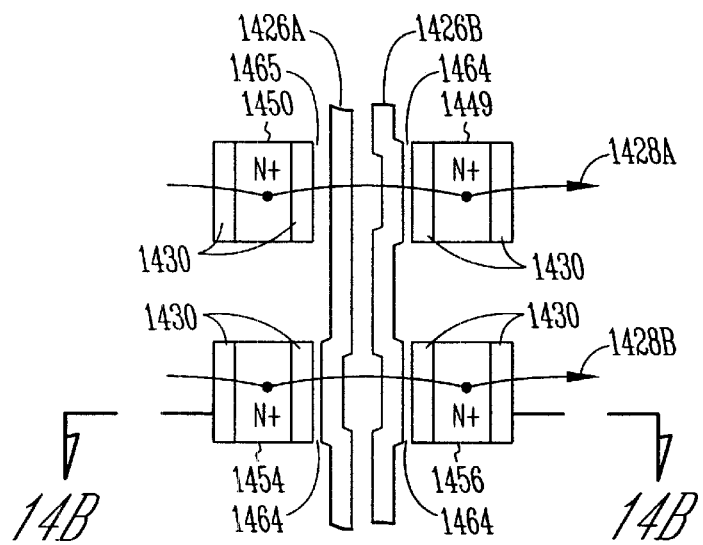
FIGS. 14A–14C are top and front views of a portion of an embodiment of the programmable logic array of FIG. 10 showing vertical gates and ultra thin single crystalline vertical transistors along both sides of each pillar described above.
Figure 14B:
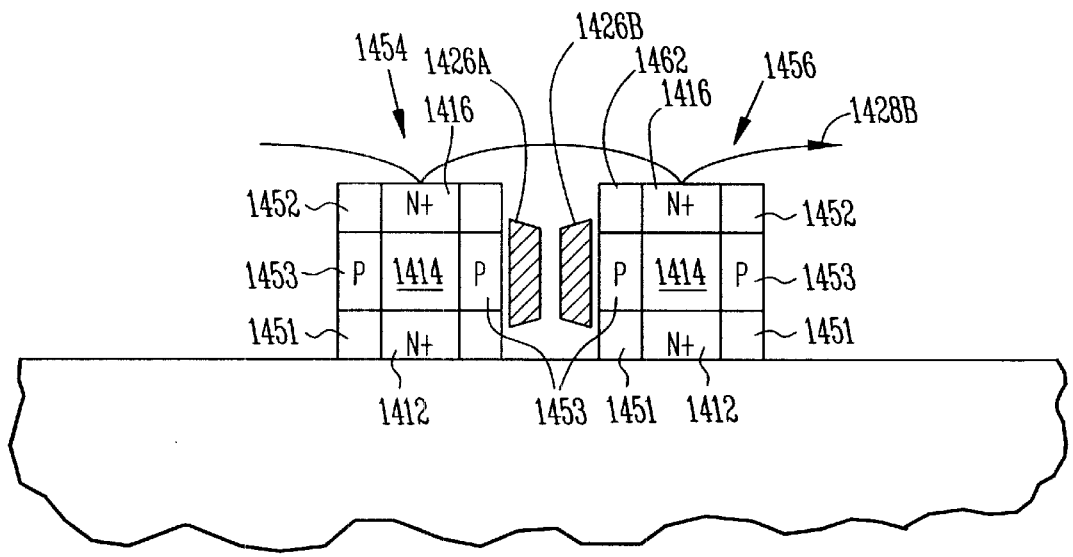

FIGS. 14A and 14B are top and front views of a portion of an embodiment of decoder 1100 of FIG. 11 showing vertical gates, as the same has been described herein, and ultra thin single crystalline vertical transistors along both sides of each pillar described above. The portion of the embodiment can represent rows and columns of pillars in either the first logic plane 1010 or the second logic plane 1020 from FIG. 10. The discussion which immediately follows references rows and columns of pillars in the first logic plane 1010. In this embodiment, each of the input lines, 1012 from FIG. 10, is formed in a trench that separates rows of ultra thin single crystalline vertical transistors. For example, FIGS. 14A and 14B illustrate a conductive line 1426 which is housed in a trench that separates pillars 1450 and 1454, from pillars 1449 and 1456. In this embodiment, the conductive line represents an input line 1426 to the programmable logic array 1000 of FIG. 10. The electrical operation of the PLA 1000 will be understood by one of ordinary skill in the art in viewing these figures. FIG. 14A illustrates that there may or may not be an ultra thin gate oxide 1464 separating the single crystalline vertical transistor 1430 on a particular side of the pillars and likewise there may or may not be an an ultra thin gate oxide 1464 separating the single crystalline vertical transistor 1430 on the other side of the pillar. If there is not an ultra thin gate oxide 1464 then the gate address lines just bypasses the pillar. As shown in FIGS. 14A and 14B, input line 1426A is a passing line for pillar 1450 with sufficient spacing, e.g. a thick oxide 1465 as described in connection with FIG. 7, from the pillar 1450 such that an inversion layer does not form in this pillar when a high voltage is applied to input line 1426A. That is, the insulator, or thick oxide layer 1465 that separates pillar 1450 from input line 1426A creates a transistor with a threshold voltage that is sufficiently high so as to exceed the most positive gate voltage to be applied in PLA 1000 such that the transistor will never turn on.

FIG. 14B shows a cross sectional view taken along cut line 14B in FIG. 14A. As described above, the ultra thin single crystalline vertical second source/drain region 1452 is coupled to a second contact layer 1416 in pillar 1454. The second contact layer 1416 in pillar 1454 is coupled to interconnect line 1428B. The interconnect line 1428B is similarly coupled to the second contact layer 1416 column adjacent pillars, e.g. 1456. In this manner, pillars 1454 and 1456 combine to provide the function of the first logic plane 1010 of PLA 1000 in FIG. 10. When a high logic level is applied to input lines 1426A and 1426B, inversion layers are formed within the ultra thin single crystalline vertical body regions, e.g. 1453, of pillars 1454 and 1456 such that the ultra thin single crystalline vertical transistors in these pillars operate as metal-oxide-semiconductor field-effect transistors (MOSFET). By turning on these ultra thin single crystalline vertical transistors, the interconnect line 1428B is brought to ground potential. Otherwise, when input lines 1426A and 1426B are grounded, the ultra thin single crystalline vertical transistors are off and the interconnect line 1428B is allowed to maintain a high logic level, unaffected by the transistors.

As one of ordinary skill in the art will understand upon reading this disclosure, the portion of the embodiment of the programmable logic array 1000 of FIG. 10 represented in FIGS. 14A and 14B can equally represent a portion of the second logic plane 1020 showing vertical split gates, as the same have been described herein, and ultra thin single crystalline vertical transistors along both sides of each of the pillars described above. In this embodiment, it is then a pair of interconnect lines 1426A and 1426B which are located between pillars 1454 and 1456. As before, in this embodiment, the ultra thin single crystalline vertical second source/drain region 1462 is coupled to a second contact layer 1416 in pillar 1454. However, in the second contact plane 1020 the second contact layer 1416 in pillar 1454 is coupled to an output line 1428B. The output line 1428B is similarly coupled to the second contact layer 1416 in column adjacent pillars, e.g. 1456. In this manner, pillars 1454 and 1456 combine to provide the function of the second logic plane 1020 in FIG. 10. When a high logic level is applied to interconnect lines 1426A and 1426B, inversion layers are formed within the ultra thin single crystalline vertical body regions, e.g. 1453, of pillars 1454 and 1454 such that the ultra thin single crystalline vertical transistors along side of these pillars operate as metal-oxide-semiconductor field-effect transistors (MOSFET). By turning on these transistors, the output line 1428B is brought to ground potential. Otherwise, when interconnect lines 1426A and 1426B are grounded, the transistors are off and the output line 1428B is allowed to maintain a high logic level, unaffected by the transistors.

As mentioned above, in the embodiment of FIGS. 14A and 14B representing the second logic plane 1020 not all of the pillars of PLA 1000 have an ultra thin gate oxide 1464 separating the ultra thin single crystalline vertical transistor along side of the pillar from the interconnect lines 1426A and 1426B. Some of the pillars are selectively separated from the interconnect lines 1426A and 1426B by a thick oxide 1465 such that the ultra thin single crystalline vertical transistor along side of the pillar is left unused so as to implement a desired logical function. For example, pillar 1450 is located at the intersection of interconnect line 1426A and output line 1428A. In this embodiment of FIG. 14A representing a portion of the second logic plane 1020, no transistor is required at this intersection. Thus, interconnect line 1426A is a passing line between pillars 1450 and 1449.

Figure 14C:
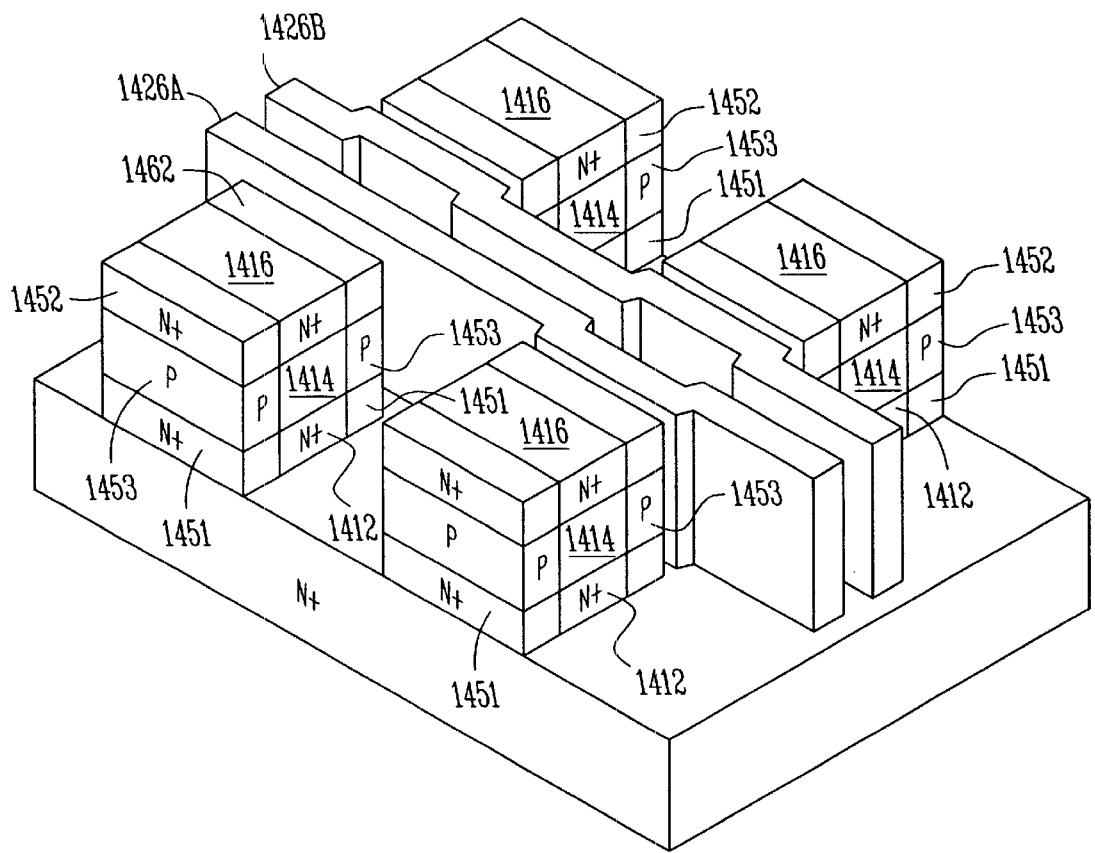

FIG. 14C is a perspective view of this embodiment whether it be in the first or the second logic planes, 1010 and 1020 respectively. In the split gate configuration a much higher density of the PLA 1000 is achieved. The embodiment using split or separate input lines 1426 in the first logic plane 1010, or split interconnect lines 1426 in the second logic plane 1020 is also understood in connection with FIG. 7. These embodiments offer the benefit of substantially reducing the area associated with each device. Here the ultra thin single crystalline vertical transistors in a given row or column in the PLA 1000 have a single gate/input line 1426 in the first logic plane 1010, and a single gate/interconnect line 1426 in the second logic plane 1020 for each input signal or interconnect signal, respectively. None of these input signals on input lines 1426 or interconnect signals on interconnect lines 1426 appear as gate potentials for the ultra thin single crystalline vertical transistors in trench opposing pillars. The split input lines 1426 in the first logic plane 1010, or the split interconnect lines 1426 in the second logic plane 1020 can be separated after a single conductive line deposition by performing a directional etch following deposition to leave the conductor on the vertical sidewalls only. The same has been explained in more detail in connection with FIG. 7.

Details of the fabrication are similar to the techniques described above in the fabrication of ultra thin single crystalline vertical transistors along side of the pillars either bulk or SOI technology, except here now additional process steps, as explained in connection with FIG. 7 are incorporated to allow the gate/input lines 1426 in the first logic plane or gate/interconnect lines 1426 in the second logic plane to bypass some pillars without activating the ultra thin single crystalline vertical transistors 1430 thereby. Again, this embodiment is referred to as the split input line 1426 or the split interconnect line 1426 embodiment, respectively, because two lines are placed between rows of pillars. The advantage of the split input line 1426 or the split interconnect line 1426 embodiment, respectively, is that the function of each transistor in PLA 1000 is implemented in a single pillar. This produces a significant increase in the density of PLA 1000.

In many of the above referenced drawings an n-channel type transistor has been depicted. However, one of ordinary skill in the art will further understand upon reading this disclosure that the conductivity types described herein can be reversed by altering doping types such that the present invention is equally applicable to include structures having ultra thin vertically oriented single crystalline p-channel type transistors. The invention is not so limited.

Conclusion

Embodiments of the present invention provide a programmable logic array with an increased density with respect to conventional programmable logic arrays. Specifically, ultra thin single crystalline vertical transistors are used at the intersection of the input lines, interconnect lines, and output lines in a first and a second logic plane respectively. The ultra thin single crystalline vertical transistors are selectively coupled by mask programming to these lines so as to implement a desired logical function.

In the solid gate implementation a high density PLA is achieved by having the address lines in trenches and utilizing the ultra thin single crystalline vertical transistors. The ultra thin vertical body structures allow transistor operation with dimensions less than 100 nm, further increasing density while suppressing short-channel effects such as drain-induced barrier lowering; threshold voltage roll off, and sub-threshold conduction. In the embodiment with split gate lines there can be separate transistors on either one or both sides of the pillar. Both of these lines could be used as normal address lines resulting in an even larger increase in the density of programmable logic arrays. Each pillar acts as a two input NOR gate rather than having to use two pillars to achieve the same logic function, basically doubling the density of the logic array.

It is to be understood that the above description is intended to be illustrative, and not restrictive. Many other embodiments will be apparent to those of skill in the art upon reviewing the above description. For example, the logical function implemented by the programmable logic array can be varied without departing from the scope of the present invention. Further, the number of input lines, interconnect lines, and output lines can be similarly varied for a specific application. Thus, the scope of the invention is not limited to the particular embodiments shown and described herein.

What is claimed:

1. A programmable logic array, comprising:
    a first logic plane that receives a number of input signals, the first logic plane having a plurality of logic cells arranged in rows and columns that are interconnected to provide a number of logical outputs;
    a second logic plane having a number of logic cells arranged in rows and columns that receive the outputs of the first logic plane and that are interconnected to produce a number of logical outputs such that the programmable logic array implements a logical function; and
    wherein each of the logic cells includes;
        a vertical pillar extending outwardly from a semiconductor substrate, wherein each pillar includes a single crystalline first contact layer and a second contact layer separated by an oxide layer; and
        at least one single crystalline ultra thin vertical transistor that is selectively disposed adjacent the vertical pillar, wherein each single crystalline vertical transistor includes;
            an ultra thin single crystalline vertical first source/drain region coupled to the first contact layer;
            an ultra thin single crystalline vertical second source/drain region coupled to the second contact layer; and an ultra thin single crystalline vertical body region which opposes the oxide layer and couples the first and the second source/drain regions.

2. The programmable logic array of claim 1, wherein the first logic plane and the second logic plane each comprise NOR planes.

3. The programmable logic array of claim 1, wherein the ultra thin single crystalline vertical body region includes a channel having a vertical length of less than 100 nanometers and wherein the ultra thin single crystalline vertical body region has a horizontal width of less than 10 nanometers.

4. The programmable logic array of claim 1, wherein the ultra thin single crystalline vertical body region is formed from solid phase epitaxial growth.

5. The programmable logic array of claim 1, wherein the single crystalline ultra thin vertical transistor includes a gate that is formed in a trench adjacent to the ultra thin single crystalline vertical body region.

6. The programmable logic array of claim 1, wherein the single crystalline ultra thin vertical transistor includes a first and a second gate that are formed in trenches adjacent to the ultra thin single crystalline vertical body region on opposite sides of the pillar.

7. The programmable logic array of claim 6, wherein a trench separates adjacent rows of pillars and the trench houses an input line that is coupled to gates of selected transistors on either side of the trench.

8. The programmable logic array of claim 6, wherein a trench separates adjacent rows of pillars and the trench houses two input lines that are each coupled to gates of selected transistors on opposing sides of the trench.

9. The programmable logic array of claim 1, wherein the ultra thin single crystalline vertical body region comprises a lightly doped body region such that the single crystalline ultra thin vertical transistor functions as a fully depleted transistor.

10. The programmable logic array of claim 1, wherein the single crystalline first contact layers of the pillars are coupled together.

11. A programmable logic array, comprising:
a plurality of input lines for receiving an input signal;
a plurality of output lines; and
one or more arrays having a first logic plane and a second logic plane connected between the input lines and the output lines, wherein the first logic plane and the second logic plane comprise a plurality of logic cells arranged in rows and columns for providing a sum-of-products term on the output lines responsive to the received input signal, wherein each logic cell includes:
an ultra thin single crystalline vertical first source/drain region;
an ultra thin single crystalline vertical second source/drain region;
an ultra thin single crystalline vertical body region, disposed alongside an oxide pillar, and which couples the first and the second source/drain regions; and
wherein a horizontal junction depth for the first and the second ultra thin single crystalline vertical source/drain regions is much less than a vertical length of the ultra thin single crystalline vertical body region.

12. A programmable logic array, comprising:
a plurality of input lines for receiving an input signal;
a plurality of output lines; and
one or more arrays having a first logic plane and a second logic plane connected between the input lines and the output lines, wherein the first logic plane and the second logic plane comprise a plurality of logic cells arranged in rows and columns for providing a sum-of-products term on the output lines responsive to the received input signal, wherein each logic cell includes:
a number of vertical pillars extending outwardly from a semiconductor substrate, wherein each pillar includes a single crystalline first contact layer and a second contact layer separated by an oxide layer;
a number of single crystalline ultra thin vertical transistor that are disposed adjacent the number of vertical pillars, wherein each single crystalline vertical transistor includes;
an ultra thin single crystalline vertical first source/drain region coupled to the first contact layer;
an ultra thin single crystalline vertical second source/drain region coupled to the second contact layer; and
an ultra thin single crystalline vertical body region which opposes the oxide layer and couples the first and the second source/drain regions.

13. The programmable logic array of claim 12, wherein each input line integrally forms a gate for addressing the body region in a pillar on a first side of a trench and is isolated from the body region in a column adjacent pillar on a second side of the trench.

14. The programmable logic array of claim 12, wherein each input line integrally forms a gate for addressing the body region in a pillar on the first side of a trench and is isolated from the body region in a row adjacent pillar on the first side of the trench.

15. The programmable logic array of claim 12, wherein each ultra thin single crystalline vertical body region includes a p-type channel having a vertical length of less than 100 nanometers.

16. The programmable logic array of claim 12, wherein the programmable logic array includes a number of buried source lines which are formed integrally with the first contact layer and are separated from the semiconductor substrate by an oxide layer.

17. The programmable logic array of claim 12, wherein each input line includes a horizontally oriented input line having a vertical side length of less than 100 nanometers.

18. The programmable logic array of claim 12, wherein each input line includes a vertically oriented input line having a vertical length of less than 100 nanometers.

19. A programmable logic array, comprising:
a plurality of input lines for receiving an input signal;
a plurality of output lines; and
one or more arrays having a first logic plane and a second logic plane connected between the input lines and the output lines, wherein the first logic plane and the second logic plane comprise a plurality of logic cells arranged in rows and columns for providing a sum-of-products term on the output lines responsive to the received input signal, wherein each logic cell includes:
a number of vertical pillars extending outwardly from a semiconductor substrate, wherein each pillar includes a single crystalline first contact layer and a second contact layer separated by an oxide layer;
a pair of single crystalline ultra thin vertical transistors formed along opposing sides of each pillar, wherein each single crystalline vertical transistor includes;
an ultra thin single crystalline vertical first source/drain region coupled to the first contact layer;
an ultra thin single crystalline vertical second source/drain region coupled to the second contact layer; and an ultra thin single crystalline vertical body region which opposes the oxide layer and couples the first and the second source/drain regions; and wherein a surface space charge region for the single crystalline vertical transistor scales down as other dimensions of the transistor scale down;

a plurality of buried source lines formed of single crystalline semiconductor material and disposed below the pillars in the array for interconnecting with the first contact layer of pillars in the array; and wherein each of the number of input lines is disposed in a trench between rows of the pillars for addressing the ultra thin single crystalline vertical body regions of the single crystalline vertical transistors that are adjacent to the trench.

20. The programmable logic array of claim 19, wherein each input line integrally forms a gate for addressing the body region in a pillar on a first side of the trench and is isolated from the body region in a column adjacent pillar on a second side of the trench.

21. The programmable logic array of claim 19, wherein each input line integrally forms a gate for addressing the body region in a pillar on the first side of the trench and is isolated from the body region in a row adjacent pillar on the first side of the trench.

22. The programmable logic array of claim 19, wherein each ultra thin single crystalline vertical body region includes a p-type channel having a vertical length of less than 100 nanometers.

23. The programmable logic array of claim 19, wherein the number of buried source lines are formed integrally with the first contact layer and are separated from the semiconductor substrate by an oxide layer.

24. The programmable logic array of claim 19, wherein each input line includes a horizontally oriented address line having a vertical side length of less than 100 nanometers.

25. The programmable logic array of claim 19, wherein each input line includes a vertically oriented input line having a vertical length of less than 100 nanometers.

26. A low voltage programmable logic array, comprising:
a number of input lines for receiving an input signal;
a number of output lines; and a first logic plane that receives a number of input signals on the number of input lines, the first logic plane having a number of logic cells arranged in rows and columns that are interconnected to provide a number of logical outputs;
a second logic plane coupled to the first logic plane by a number of interconnect lines, the second logic plane having a number of logic cells arranged in rows and columns that receive the outputs of the first logic plane on the interconnect lines and that are interconnected to produce a number of logical outputs on the output lines such that the programmable logic array implements a logical function;
wherein each logic cell includes:
a vertical pillar extending outwardly from a semiconductor substrate at intersections of the input lines and interconnect lines and at the intersections of the interconnect lines and the output lines, wherein each pillar includes a single crystalline first contact layer and a second contact layer separated by an oxide layer; and
a number of single crystalline ultra thin vertical transistors formed along selected sides of each pillar, wherein each single crystalline vertical transistor includes;
an ultra thin single crystalline vertical first source/drain region coupled to the first contact layer;
an ultra thin single crystalline vertical second source/drain region coupled to the second contact layer;
an ultra thin single crystalline vertical body region which opposes the oxide layer and couples the first and the second source/drain regions; and
a gate opposing the vertical body region and separated therefrom by a gate oxide;
a number of buried source lines formed of single crystalline semiconductor material and disposed below the pillars in the array for interconnecting with the first contact layer of pillars in the array.

27. The low voltage programmable logic array of claim 26, wherein the number of input lines are disposed in a trench between rows of the pillars in the first logic plane for addressing gates of the single crystalline vertical transistors that are adjacent to the trench in selected pillars, and wherein the number of interconnect lines couple to the second contact layer in columns of pillars for implementing a logic function in the first logic plane.

28. The low voltage programmable logic array of claim 26, wherein the number of interconnect lines are disposed in a trench between rows of the pillars in the second logic plane for addressing gates of the single crystalline vertical transistors that are adjacent to the trench in selected pillars, and wherein the number of output lines couple to the second contact layer in columns of pillars for implementing a logic function in the second logic plane.

29. The low voltage programmable logic array of claim 27, wherein each gate adjacent to a first side of the trench along a row of pillars in the first logic plane is integrally formed with one of the number of first input lines in the adjacent trench, and wherein each of the number of first input lines includes a vertically oriented input line having a vertical length of less than 100 nanometers.

30. The low voltage programmable logic array of claim 28, wherein each gate adjacent to a first side of the trench along a row of pillars in the second logic plane is integrally formed with one of the number of interconnect lines in the adjacent trench, and wherein each of the number of interconnect lines includes a horizontally oriented interconnect line having a side with a vertical length of less than 100 nanometers.

31. The low voltage programmable logic array of claim 26, wherein each single crystalline vertical transistor has a vertical length of less than 100 nanometers and a horizontal width of less than 10 nanometers.

32. An electronic system, comprising:
a memory;
a processor coupled to the memory; and
wherein the processor includes at least one programmable logic array including:
a first logic plane that receives a number of input signals, the first logic plane having a plurality of logic cells arranged in rows and columns that are interconnected to provide a number of logical outputs;
a second logic plane having a number of logic cells arranged in rows and columns that receive the outputs of the first logic plane and that are interconnected to produce a number of logical outputs such that the programmable logic array implements a logical function; and
wherein each of the logic cells includes;
a vertical pillar extending outwardly from a semiconductor substrate, wherein each pillar includes a single crystalline first contact layer and a second contact layer separated by an oxide layer; and at least one single crystalline ultra thin vertical transistor that is selectively disposed adjacent the vertical pillar, wherein each single crystalline vertical transistor includes;
an ultra thin single crystalline vertical first source/drain region coupled to the first contact layer;
an ultra thin single crystalline vertical second source/drain region coupled to the second contact layer; and
an ultra thin single crystalline vertical body region which opposes the oxide layer and couples the first and the second source/drain regions.

33. The electronic system of claim 32, wherein the first logic plane and the second logic plane each comprise NOR planes.

34. The electronic system of claim 32, wherein the ultra thin single crystalline vertical body region includes a channel having a vertical length of less than 100 nanometers and wherein the ultra thin single crystalline vertical body region has a horizontal width of less than 10 nanometers.

35. The electronic system of claim 32, wherein the ultra thin single crystalline vertical body region is formed from solid phase epitaxial growth.

36. The electronic system of claim 32, wherein the single crystalline ultra thin vertical transistor includes a gate that is formed in a trench adjacent to the ultra thin single crystalline vertical body region.

37. The electronic system of claim 32, wherein each pillar includes a pair of single crystalline ultra thin vertical transistors formed on opposing sides of the pillar, and wherein each single crystalline ultra thin vertical transistor includes a gate that is formed in a trench adjacent to the ultra thin single crystalline vertical body region on opposite sides of the pillar.

38. The electronic system of claim 37, wherein a trench separates adjacent rows of pillars and the trench houses an input line that is coupled to gates of selected transistors in column adjacent pillars on either side of the trench.

39. The electronic system of claim 32, wherein a trench separates adjacent rows of pillars and the trench houses two input lines, wherein each input line is coupled to gates of selected transistors on opposing sides of the trench.

40. The electronic system of claim 32, wherein each ultra thin single crystalline vertical body region comprises a lightly doped body region such that the single crystalline ultra thin vertical transistor functions as a fully depleted transistor.

41. The electronic system of claim 32, wherein the single crystalline first contact layers of the pillars are coupled together.

42. An electronic system, comprising:
a memory;
a processor coupled to the memory; and
wherein the processor includes at least one programmable logic array including:
one or more arrays having a first logic plane and a second logic plane connected between the input lines and the output lines, wherein the first logic plane and the second logic plane comprise a plurality of logic cells arranged in rows and columns for providing a sum-of-products term on the output lines responsive to the received input signal, wherein each logic cell includes:
an ultra thin single crystalline vertical first source/drain region;
an ultra thin single crystalline vertical second source/drain region;
an ultra thin single crystalline vertical body region, disposed alongside an oxide pillar, and which couples the first and the second source/drain regions; and
wherein a horizontal junction depth for the first and the second ultra thin single crystalline vertical source/drain regions is much less than a vertical length of the ultra thin single crystalline vertical body region.

43. An electronic system, comprising:
a memory;
a processor coupled to the memory; and
wherein the processor includes at least one programmable logic array including:
a number of input lines for receiving an input signal;
a number of output lines; and
one or more arrays having a first logic plane and a second logic plane connected between the input lines and the output lines, wherein the first logic plane and the second logic plane comprise a number of logic cells arranged in rows and columns for providing a sum-of-products term on the output lines responsive to the received input signal, wherein each logic cell includes:
a number of vertical pillars extending outwardly from a semiconductor substrate, wherein each pillar includes a single crystalline first contact layer and a second contact layer separated by an oxide layer; and
a number of single crystalline ultra thin vertical transistor that are disposed adjacent the number of vertical pillars, wherein each single crystalline vertical transistor includes;
an ultra thin single crystalline vertical first source/drain region coupled to the first contact layer;
an ultra thin single crystalline vertical second source/drain region coupled to the second contact layer; and
an ultra thin single crystalline vertical body region which opposes the oxide layer and couples the first and the second source/drain regions.

44. The electronic system of claim 43, wherein each input line integrally forms a gate for addressing the body region in a pillar on a first side of a trench and is isolated from the body region in a column adjacent pillar on a second side of the trench.

45. The electronic system of claim 43, wherein each input line integrally forms a gate for addressing the body region in a pillar on the first side of a trench and is isolated from the body region in a row adjacent pillar on the first side of the trench.

46. The electronic system of claim 43, wherein each ultra thin single crystalline vertical body region includes a p-type channel having a vertical length of less than 100 nanometers.

47. The electronic system of claim 43, wherein the programmable logic array includes a number of buried source lines which are formed integrally with the first contact layer and are separated from the semiconductor substrate by an oxide layer.

48. The electronic system of claim 43, wherein each input line includes a horizontally oriented input line having a vertical side length of less than 100 nanometers.

49. The electronic system of claim 43, wherein each input line includes a vertically oriented input line having a vertical length of less than 100 nanometers.

50. An electronic system, comprising:
a memory;
a processor coupled to the memory; and
wherein at least one of the processor and memory include a programmable logic array including:
  a number of input lines for receiving an input signal;
  a number of output lines;
  a first logic plane that receives a number of input signals on the number of input lines, the first logic plane having a number of logic cells arranged in rows and columns that are interconnected to provide a number of logical outputs;
  a second logic plane coupled to the first logic plane by a number of interconnect lines, the second logic plane having a number of logic cells arranged in rows and columns that receive the outputs of the first logic plane on the interconnect lines and that are interconnected to produce a number of logical outputs on the output lines such that the programmable logic array implements a logical function;
wherein each logic cell includes:
  a vertical pillar extending outwardly from a semiconductor substrate at intersections of the input lines and interconnect lines and at the intersections of the interconnect lines and the output lines, wherein each pillar includes a single crystalline first contact layer and a second contact layer separated by an oxide layer; and
  a number of single crystalline ultra thin vertical transistors formed along selected sides of each pillar, wherein each single crystalline vertical transistor includes;
    an ultra thin single crystalline vertical first source/drain region coupled to the first contact layer;
    an ultra thin single crystalline vertical second source/drain region coupled to the second contact layer;
    an ultra thin single crystalline vertical body region which opposes the oxide layer and couples the first and the second source/drain regions; and
    a gate opposing the vertical body region and separated therefrom by a gate oxide;
  a number of buried source lines formed of single crystalline semiconductor material and disposed below the pillars in the array for interconnecting with the first contact layer of pillars in the array.

51. The electronic system of claim 50, wherein the number of input lines are disposed in a trench between rows of the pillars in the first logic plane for addressing gates of the single crystalline vertical transistors that are adjacent to the trench in selected pillars, and wherein the number of interconnect lines couple to the second contact layer in columns of pillars in the first logic plane for implementing a logic function in the first logic plane.

52. The electronic system of claim 50, wherein the number of interconnect lines are disposed in a trench between rows of the pillars in the second logic plane for addressing gates of the single crystalline vertical transistors that are adjacent to the trench in selected pillars, and wherein the number of output lines couple to the second contact layer in columns of pillars in the second logic plane for implementing a logic function in the second logic plane.

53. The electronic system of claim 51, wherein each gate adjacent to a first side of the trench along a row of pillars in the first logic plane is integrally formed with one of the number of first input lines in the adjacent trench, and wherein each of the number of first input lines includes a vertically oriented input line having a vertical length of less than 100 nanometers.

54. The electronic system of claim 52, wherein each gate adjacent to a first side of the trench along a row of pillars in the second logic plane is integrally formed with one of the number of interconnect lines in the adjacent trench, and wherein each of the number of interconnect lines includes a horizontally oriented interconnect line having a side with a vertical length of less than 100 nanometers.

55. The electronic system of claim 50, wherein each single crystalline vertical transistor has a vertical length of less than 100 nanometers and a horizontal width of less than 10 nanometers.

56. A method for forming a programmable logic array, comprising:
  forming a first logic plane that receives a number of input signals, wherein forming the first logic plane includes forming a number of logic cells arranged in rows and columns that are interconnected to provide a number of logical outputs;
  forming a second logic plane, wherein forming the second logic plane includes forming a number of logic cells arranged in rows and columns that receive the outputs of the first logic plane and that are interconnected to produce a number of logical outputs such that the programmable logic array implements a logical function; and
wherein forming each of the logic cells includes;
  forming a vertical pillar extending outwardly from a semiconductor substrate, wherein forming each pillar includes forming a single crystalline first contact layer and a second contact layer of a first conductivity type separated by an oxide layer; and
  forming a single crystalline ultra thin vertical transistor that is selectively disposed adjacent the vertical pillar, wherein forming the single crystalline vertical transistor includes;
    depositing a lightly doped polysilicon layer of a second conductivity type over the pillar and directionally etching the polysilicon layer of the second conductivity type to leave only on sidewalls of the pillars;
    annealing the pillar such that the lightly doped polysilicon layer of the second conductivity type recrystallizes and lateral epitaxial solid phase regrowth occurs vertically to form a single crystalline vertically oriented material of the second conductivity type; and
    wherein the annealing causes the single crystalline first and second contact layers of a first conductivity type seed a growth of single crystalline material of the first conductivity type into the lightly doped polysilicon layer of the second type to form vertically oriented first and second source/drain regions of the first conductivity type separated by a body region formed of the single crystalline vertically oriented material of the second conductivity type.

57. The method of claim 56, wherein forming the first logic plane and the second logic plane each comprise forming NOR planes.

58. The method of claim 56, wherein forming the single crystalline vertical transistor includes forming a single crystalline vertical transistor having a vertical length of less than 100 nanometers and a horizontal width of less than 10 nanometers.

59. The method of claim 56, wherein forming the single crystalline ultra thin vertical transistor includes forming a gate in a trench adjacent to the ultra thin single crystalline vertical body region.

60. The method of claim 56, wherein forming the single crystalline ultra thin vertical transistor includes forming a pair of single crystalline ultra thin vertical transistors on opposing sides of each pillar, and forming a gate in a trenche adjacent to the ultra thin single crystalline vertical body region on opposite sides of the pillar.

61. The method of claim 56, wherein the method includes forming a trench which separates adjacent rows of pillars, and wherein forming the trench includes forming a trench that houses an input line for addressing the ultra thin single crystalline vertical body region of selected transistors on either side of the trench.

62. The method of claim 61, wherein forming a trench that separates adjacent rows of pillars includes forming a pair of input lines input lines in each trench for addressing the ultra thin single crystalline vertical body region of selected transistors on opposing sides of the trench.

63. The method of claim 56, wherein forming the ultra thin single crystalline vertical body region comprises forming a lightly doped body region such that the single crystalline ultra thin vertical transistor functions as a fully depleted transistor.

64. The method of claim 56, wherein forming the single crystalline first contact layer includes integrally forming a more heavily doped source line which couples the first contact layer in column adjacent pillars together.

65. A method for forming a programmable logic array, comprising:
forming a plurality of input lines for receiving an input signal;
forming a plurality of output lines; and
forming one or more arrays having a first logic plane and a second logic plane connected between the input lines and the output lines, wherein forming the first logic plane and the second logic plane forming a plurality of logic cells arranged in rows and columns for providing a sum-of-products term on the output lines responsive to the received input signal, wherein forming each logic cell includes:
forming an ultra thin single crystalline vertical first source/drain region;
forming an ultra thin single crystalline vertical second source/drain region;
forming an ultra thin single crystalline vertical body region disposed alongside an oxide pillar and which couples the first and the second source/drain regions; and
wherein forming each logic cell includes forming a horizontal junction depth for the first and the second ultra thin single crystalline vertical source/drain regions which is much less than a vertical length of the ultra thin single crystalline vertical body region.

66. A method for forming a programmable logic array, comprising:
forming a plurality of input lines for receiving an input signal;
forming a plurality of output lines; and
forming one or more arrays having a first logic plane and a second logic plane connected between the input lines and the output lines, wherein forming the first logic plane and the second logic plane includes forming a plurality of logic cells arranged in rows and columns for providing a sum-of-products term on the output lines responsive to the received input signal, wherein forming each logic cell includes:
forming a pillar extending outwardly from a semiconductor substrate, wherein forming each pillar includes forming a single crystalline first contact layer and a second contact layer separated by an oxide layer; and
forming a single crystalline ultra thin vertical transistor which is disposed adjacent the vertical pillar, wherein forming the single crystalline vertical transistor includes;
depositing a lightly doped polysilicon layer of a second conductivity type over each pillar and directionally etching the polysilicon layer of the second conductivity type to leave only on sidewalls of the pillars;
annealing the pillar such that the lightly doped polysilicon layer of the second conductivity type recrystallizes and lateral epitaxial solid phase regrowth occurs vertically to form a single crystalline vertically oriented material of the second conductivity type; and
wherein the annealing causes the single crystalline first and second contact layers of a first conductivity type seed a growth of single crystalline material of the first conductivity type into the lightly doped polysilicon layer of the second type to form vertically oriented first and second source/drain regions of the first conductivity type separated by a body region formed of the single crystalline vertically oriented material of the second conductivity type.

67. The method of claim 66, wherein forming each input line includes integrally forming a gate for addressing the body region in a pillar on a first side of a trench and isolating the input line from the body region in a column adjacent pillar on a second side of the trench.

68. The method of claim 66, wherein forming each input line includes integrally forming a gate for addressing the body region in a pillar on the first side of a trench and isolating the input line from the body region in a row adjacent pillar on the first side of the trench.

69. The method of claim 66, wherein forming the ultra thin single crystalline vertical body region of a second conductivity type includes forming a p-type body region having a vertical length of less than 100 nanometers.

70. The method of claim 66, wherein forming the programmable logic array further includes forming a number of buried source lines which are formed integrally with the first contact layer and are separated from the semiconductor substrate by an oxide layer.

71. The method of claim 66, wherein forming each input line includes forming a horizontally oriented input line having a vertical side length of less than 100 nanometers.

72. The method of claim 66, wherein forming each input line includes forming a vertically oriented input line having a vertical length of less than 100 nanometers.

73. A method of forming a low voltage programmable logic array, comprising:
forming a number of input lines for receiving an input signal;
forming a number of output lines;
forming a first logic plane that receives a number of input signals on the number of input lines, wherein forming the first logic plane includes forming a number of logic cells arranged in rows and columns that are interconnected to provide a number of logical outputs;

forming a second logic plane coupled to the first logic plane by forming a number of interconnect lines, wherein forming the second logic plane includes forming a number of logic cells arranged in rows and columns that receive the outputs of the first logic plane on the interconnect lines and that are interconnected to produce a number of logical outputs on the output lines such that the programmable logic array implements a logical function;

wherein forming each logic cell includes;

forming a vertical pillar extending outwardly from a semiconductor substrate at intersections of the input lines and interconnect lines and at the intersections of the interconnect lines and the output lines, wherein forming each pillar includes forming a single crystalline first contact layer and a second contact layer separated by an oxide layer; and forming a number of single crystalline ultra thin vertical transistors formed along selected sides of each pillar, wherein forming each single crystalline vertical transistor includes;

depositing a lightly doped polysilicon layer of a second conductivity type over each pillar and directionally etching the polysilicon layer of the second conductivity type to leave only on sidewalls of the pillars;

annealing the pillar such that the lightly doped polysilicon layer of the second conductivity type recrystallizes and lateral epitaxial solid phase regrowth occurs vertically to form a single crystalline vertically oriented material of the second conductivity type; and wherein the annealing causes the single crystalline first and second contact layers of a first conductivity type seed a growth of single crystalline material of the first conductivity type into the lightly doped polysilicon layer of the second type to form vertically oriented first and second source/drain regions of the first conductivity type separated by a body region formed of the single crystalline vertically oriented material of the second conductivity type; and forming a number of buried source lines formed of single crystalline semiconductor material and disposed below the pillars in the array for interconnecting with the first contact layer of pillars in the array.

74. The method of claim 73, wherein forming the number of input lines includes forming the number of input lines disposed in a trench between rows of the pillars in the first logic plane for addressing gates of the single crystalline vertical transistors that are adjacent to the trench in selected pillars, and wherein forming the number of interconnect lines includes coupling the number of interconnect lines to the second contact layer in columns of pillars for implementing a logic function in the first logic plane.

75. The method of claim 73, wherein forming the number of interconnect lines includes forming the number of interconnect lines disposed in a trench between rows of the pillars in the second logic plane for addressing gates of the single crystalline vertical transistors that are adjacent to the trench in selected pillars, and wherein the forming the number of output lines includes coupling the number of output lines to the second contact layer in columns of pillars for implementing a logic function in the second logic plane.

76. The method of claim 74, wherein forming the number of input lines includes integrally forming a gate adjacent the single crystalline vertical transistors that are adjacent to the trench in selected pillars in the first logic plane, and wherein forming each of the number of first input lines includes forming a vertically oriented input line having a vertical length of less than 100 nanometers.

77. The method of claim 75, wherein forming the number of interconnect lines includes integrally forming a gate adjacent the single crystalline vertical transistors that are adjacent to the trench in selected pillars in the second logic plane, and wherein forming each of the number of interconnect lines includes forming a horizontally oriented interconnect line having a side with a vertical length of less than 100 nanometers.

78. The method of claim 73, wherein forming each single crystalline vertical transistor includes forming a single crystalline vertical transistor having a vertical length of less than 100 nanometers and a horizontal width of less than 10 nanometers.

* * * * *

UNITED STATES PATENT AND TRADEMARK OFFICE
CERTIFICATE OF CORRECTION

PATENT NO.     : 6,496,034 B2
DATED          : December 17, 2002
INVENTOR(S)    : Leonard Forbes and Kie Y. Ahn It is certified that error appears in the above-identified patent and that said Letters Patent is hereby corrected as shown below:

Column 2,
Lines 43 and 46, delete "A" after "1000" and insert -- Å -- therefor.

Column 3,
Line 16, delete "." after "Each".
Line 44, delete "A" after "1000" and insert -- Å -- therefor.

Column 6,
Line 17, delete "know" before "techniques" and insert -- known -- therefor.
Line 58, delete "FIGS." before "3B" and insert -- FIG. -- therefor.

Column 11,
Line 5, delete "A" before "oxide" and insert -- An -- therefor.
Line 50, delete "a" before "Then".

Column 12,
Line 30, delete "." after "constructed".

Column 19,
Line 21, delete "FIGS." before "7" and insert -- FIG. -- therefor.

Column 20,
Line 65, delete second instance of "1454" and insert -- 1456 -- therefor.

UNITED STATES PATENT AND TRADEMARK OFFICE
CERTIFICATE OF CORRECTION

PATENT NO. : 6,496,034 B2
DATED : December 17, 2002
INVENTOR(S) : Leonard Forbes and Kie Y. Ahn It is certified that error appears in the above-identified patent and that said Letters Patent is hereby corrected as shown below:

Column 31,
Line 8, delete "trenche" and insert -- trench -- therefor.
Line 19, delete second instance of "input lines".

Signed and Sealed this

Twelfth Day of August, 2003

JAMES E. ROGAN
*Director of the United States Patent and Trademark Office*